(12) United States Patent
Usami

(10) Patent No.: US 7,692,545 B2
(45) Date of Patent: Apr. 6, 2010

(54) WIRELESS IC TAG AND PROCESS FOR MANUFACTURING THE SAME

(75) Inventor: Mitsuo Usami, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 442 days.

(21) Appl. No.: 11/596,111

(22) PCT Filed: May 18, 2004

(86) PCT No.: PCT/JP2004/007048

§ 371 (c)(1),
(2), (4) Date: Nov. 9, 2006

(87) PCT Pub. No.: WO2005/112195

PCT Pub. Date: Nov. 24, 2005

(65) Prior Publication Data

US 2007/0229277 A1    Oct. 4, 2007

(51) Int. Cl.
*G08B 13/14*    (2006.01)

(52) U.S. Cl. .............. 340/572.7; 340/572.4; 340/572.5; 340/572.8; 340/505; 340/522; 235/379; 235/380; 235/440; 235/492

(58) Field of Classification Search .............. 340/572.7, 340/572.4, 572.8, 572.5, 505, 522; 235/379, 235/380, 440, 492
See application file for complete search history.

(56) References Cited

U.S. PATENT DOCUMENTS

| | | | |
|---|---|---|---|
| 5,099,227 A * | 3/1992 | Geiszler et al. .......... 340/572.5 |
| 5,940,006 A * | 8/1999 | MacLellan et al. ......... 340/10.1 |
| 6,010,075 A * | 1/2000 | Ishifuji et al. ............... 235/492 |
| 6,079,619 A | 6/2000 | Teraura et al. |
| 7,036,741 B2 | 5/2006 | Usami et al. |
| 7,061,083 B1 | 6/2006 | Usami et al. |
| 2002/0074666 A1 | 6/2002 | Usami |
| 2003/0169204 A1 | 9/2003 | Saito |

(Continued)

FOREIGN PATENT DOCUMENTS

JP    11-053492    8/1997

(Continued)

OTHER PUBLICATIONS

International Search Report of PCT/JP2004/007048 mailed Jul. 13, 2004.

*Primary Examiner*—Tai T Nguyen
(74) *Attorney, Agent, or Firm*—Stites & Harbison PLLC; Juan Carlos A. Marquez, Esq.

(57) ABSTRACT

There is a problem related to radio wave interference, e.g. the shade of radio wave of a radio IC tag, when a plurality of radio IC tags are present in a region of electromagnetic wave. When a plurality of antennas each having a large area are present in the vicinity of the radio IC tag, the radio IC tag easily receives the affect of an antenna conductor. In a plurality of radio IC tags present in a radio wave area, width of the antenna conductor of the radio IC tag is set at 1.0 mm or less. Furthermore, in order to realize an antenna conductor having a small width, an IC tag chip of both side electrode structure having electrodes on the front surface and rear surface of a chip is sandwiched between antennas.

4 Claims, 20 Drawing Sheets

U.S. PATENT DOCUMENTS

2005/0253726 A1 * 11/2005 Yoshida et al. .......... 340/572.8

FOREIGN PATENT DOCUMENTS

| JP | 2000-332523 | 5/1999 |
| JP | 2002-184872 | 12/2000 |
| JP | 2003-296679 | 3/2002 |
| JP | 2004-127230 | 12/2002 |
| JP | 2004-078991 | 10/2003 |

* cited by examiner

MEMORY OUT

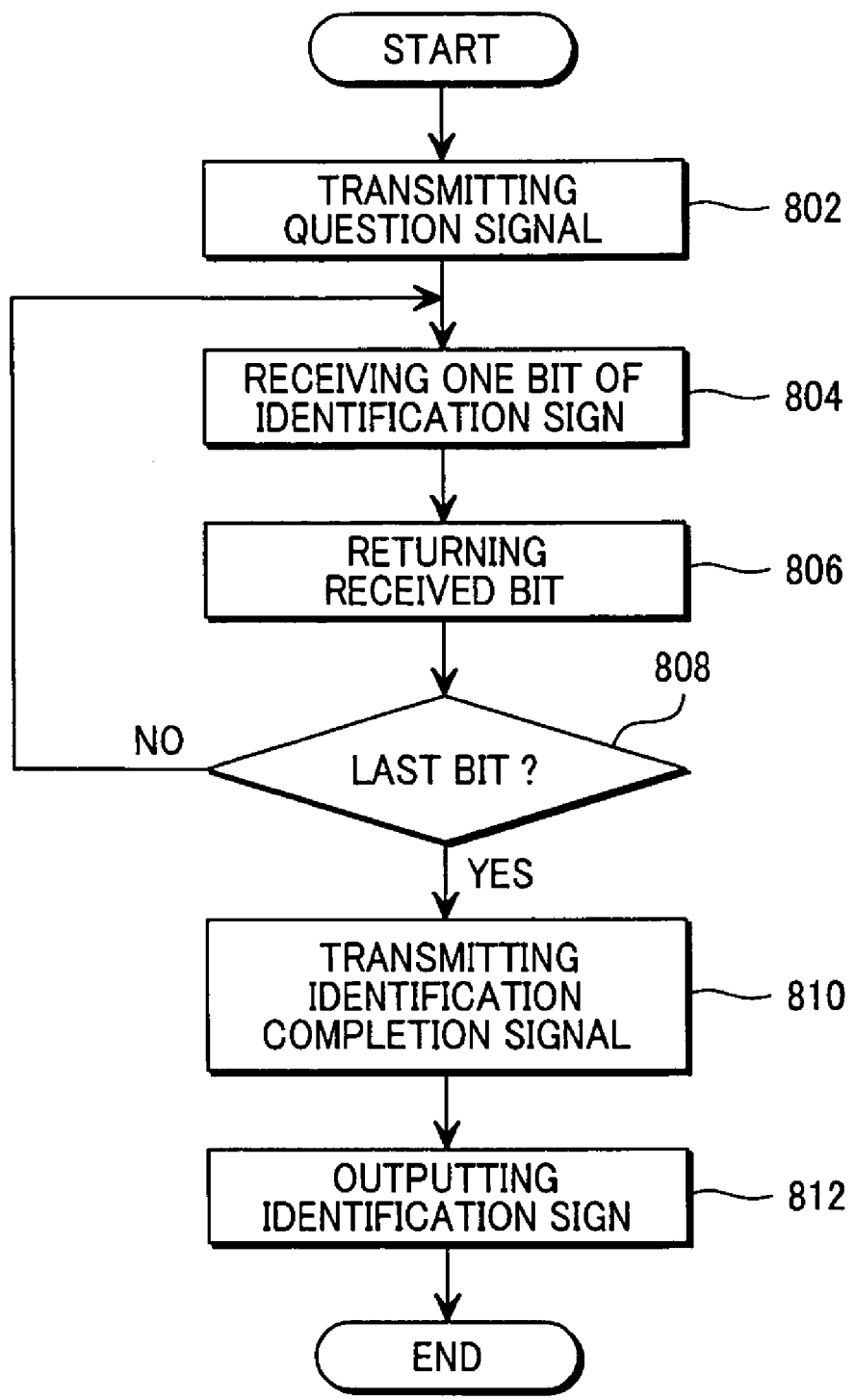

(a)                    (b)

(COMPARISON EXAMPLE)

(MICROWAVE)

(COMPARISON EXAMPLE)

WIRELESS IC TAG AND PROCESS FOR MANUFACTURING THE SAME

TECHNICAL FIELD

The present invention relates to a wireless IC tag wirelessly identified and a process of manufacturing the same, and more particularly to a wireless IC tag having a congestion control function and a process for manufacturing the same.

BACKGROUND ART

A wireless IC tag has identification information about a product or the like to which it is adhered, and by reading the identification information, is used for widespread application such as is read for stock control, product inspection, and history management. For example, the wireless IC tags are used to individually identify and manage a large number of cartridge products housed in a carton. In this case, even when two products are close to each other, to correctly identify them by IC tags, wireless IC tags tolerant of radio wave interference are required.

As an example of wireless IC tags tolerant of radio wave interference, technology disclosed in Japanese Patent Laid-Open No. H11-53492 exists. In this prior art, in ID tags that receive operational power from the outside, when plural ID tags are close to each other, in order that they exert no bad influence to other ID tags during reception of radio waves for power, a resonance circuit comprising a coil for antennas and a resonance capacitor is provided to receive radio waves sent from the outside. A relay is provided in a serial circuit comprising the coil and the resonance capacitor, performs predetermined processing for multi-read commands for external equipments to obtain data from plural ID tags, and then turns off the relay to avoid the reception of radio waves sent from the outside.

As another example of wireless IC tags, technology disclosed in Japanese Patent Laid-Open No. 2000-332523 exists. This technology intends to facilitate manufacturing by broadening the band without deteriorating antenna sensitivity of wireless IC tags and enhancing yield against manufacturing variations. To achieve this, the wireless IC tag includes: a ½-wavelength antenna composed of a microstrip line that includes an antenna, a grounded conductor, and a dielectric between the antenna and the grounded conductor; and one or more wire-shaped conductors for connecting a middle point of the antenna and the grounded conductor, and incorporates an IC between the antenna and the grounded conductor.

The prior art having the antenna composed of a microstrip line has a back side antenna pattern and a surface antenna pattern that are shorted by a through hole, and perform impedance matching by a side short pattern. In the prior art, the shape of the back antenna pattern deciding the antenna size of the wireless IC tag is about 50 to 60 mm in the longer antenna and about 5 to 15 mm in the shorter antenna.

On the other hand, semiconductor chips for a wireless IC tag connected to an antenna that have a size of 0.5 mm or less are disclosed in Japanese Patent Laid-Open Nos. 2002-184872, 2003-296679, 2004-46903, and 2004-78991.

DISCLOSURE OF THE INVENTION

Since a wireless IC tag has antenna conductors, a problem of radio wave interference by the antenna occurs in wireless IC tags having a congestion control function.

Regarding this problem, in an example disclosed in Japanese Patent Laid-Open No. H11-53492, to avoid radio wave interference, relay elements are Introduced in a wireless tag. In such a system, problems such as an increase in physical size due to the relay elements and the loss of cost efficiency exist, and the formation of small-sized wireless IC tags and economical wireless IC tags is difficult.

In the above-described Japanese Patent Laid-Open No. 2000-332523, technology for broadening antenna width is disclosed to manufacture antennas excellent in production efficiency. However, no reference is made to the problem of radio wave interference when plural wireless tags are in an area of electromagnetic waves. The technology does not solve the problem of radio wave interference. Rather, the technology amplifies this problem because of the lack of constraints on antenna size.

In a state in which plural wireless IC tags exist within electromagnetic waves from a reader and are multi-read, as disclosed in Japanese Patent Laid-Open No. 2000-332523, wireless IC tags with a wide antenna width are problematic in that they are susceptible to the influence of radio wave interference because of the existence of the shade of radio waves.

The wireless IC tag described in the above-described Japanese Patent Laid-Open Nos. 2002-184872, 2003-296679, 2004-46903, and 2004-78991 do not include a congestion control circuit within a semiconductor chip, and a full study is not made of the problem of radio wave interference when wireless tags are in an area of electromagnetic waves.

An object of the present invention is to provide a wireless IC tag that has strength in congestion control tolerant of the influence of radio wave interference in a state in which plural wireless IC tags exist within electromagnetic waves from a reader and are multi-read.

Another object of the present invention is to provide a wireless IC tag which is compact in size, has high productivity, and excellent economic efficiency, and which has strength in congestion control tolerant of the influence of radio wave interference.

Another object of the present invention is to provide a wireless IC tag that has various usage patterns and reading forms and has strength in congestion control tolerant of the influence of radio wave interference in any states.

To solve the above-described problem, a wireless IC tag according to one aspect of the present invention includes an IC tag chip having a memory storing specific identification information, and an antenna, wherein the IC tag chip has at least a congestion control part, and has a function to deliver the identification information via the antenna in response to an inquiry from a reader existing within a communication area. The antenna is a dipole antenna that is connected to the IC tag chip and includes a pair of antenna conductors extending in an axial direction at both sides of the IC tag chip, and the width of the antenna conductors is 1.0 mm or less.

In the present invention, the width of the wireless IC tag of the width of the antenna denotes a substantial maximum value of antenna width projected to radio waves from the reader.

A wireless IC tag according to another aspect of the present invention includes an IC tag chip having a memory storing specific identification information, and an antenna, wherein the IC tag chip has at least a rectifying part and a congestion control part, and has a function to deliver the identification information via the antenna in response to an inquiry from a reader existing within a communication area. Radio waves used for communication with the reader are microwaves, and electrodes are formed on the surface and the back surface of the IC tag chip, the electrodes of the IC tag chip are respectively connected to a pair of antenna conductors of the dipole antenna, and the width of the antenna conductors is in a range from 0.5 to 0.001 mm.

A wireless IC tag according to other aspects of the present invention is targeted for reading of an identification number by multiple congestion controls in a state in which plural wireless IC tags exist within a radio wave area of a reader. A pair of antenna conductors are connected to the electrodes of the IC tag chip, a dipole antenna extending in an axial direction is formed at both sides of the IC tag chip, and the width of the IC tag chip and the antenna conductors is 1.0 mm or less.

According to another aspect of the present invention, a wireless IC tag has the IC tag chip disposed on the inside of the ends of the antenna conductors.

Further, according to another aspect of the present invention, in a wireless IC tag, the sectional shape of the antenna conductors is circular, and the IC tag chip is disposed inside the ends of the antenna conductors.

According to the present invention, a wireless IC tag can be formed which is compact in size, has excellent economic efficiency, and is tolerant of radio wave interference, which has been impossible with conventional wireless IC tags. By narrowing down the size of an antenna, in comparison with a wide antenna, a simple and effective wireless IC tag has been formed with reduction in the shade and a reflection amount of radio waves which will cause radio wave interference.

BRIEF DESCRIPTION OF THE DRAWINGS

FIG. 8A is a drawing showing the operation procedure of a congestion control circuit of a reader;

BEST MODE FOR CARRYING OUT THE INVENTION

Hereinafter, embodiments of a wireless IC tag of the present invention will be described with reference to the accompany drawings.

First Embodiment

A first embodiment of the present invention will be described with reference to FIGS. 1 to 13.

Figure 1:
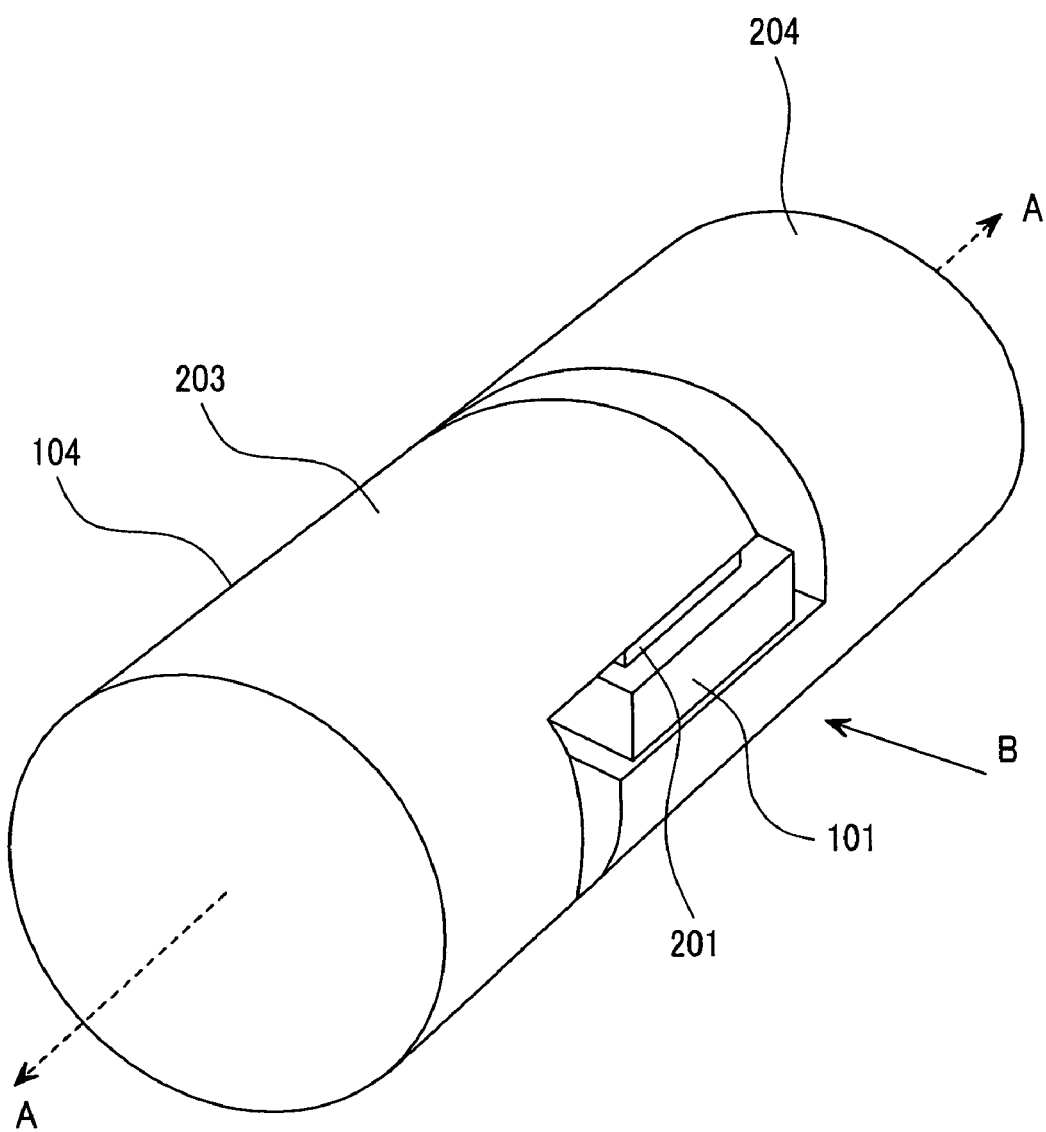
FIG. 1 is a drawing showing the structure of a wireless IC tag according to a first embodiment of the present invention.
Figure 2:
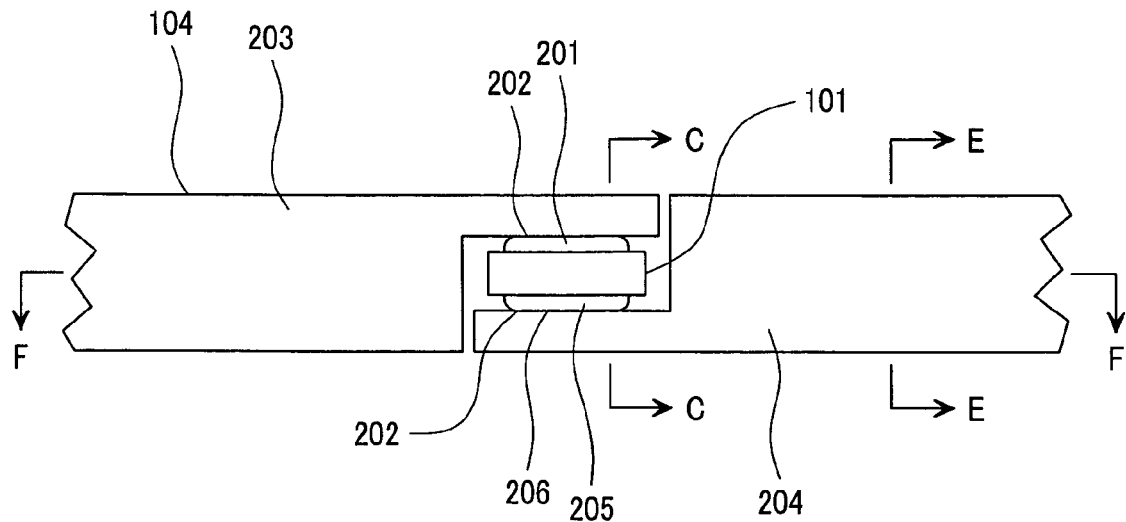
FIG. 2 is a drawing showing the sectional structure of the wireless IC tag of FIG. 1 in the B direction.
Figure 3:
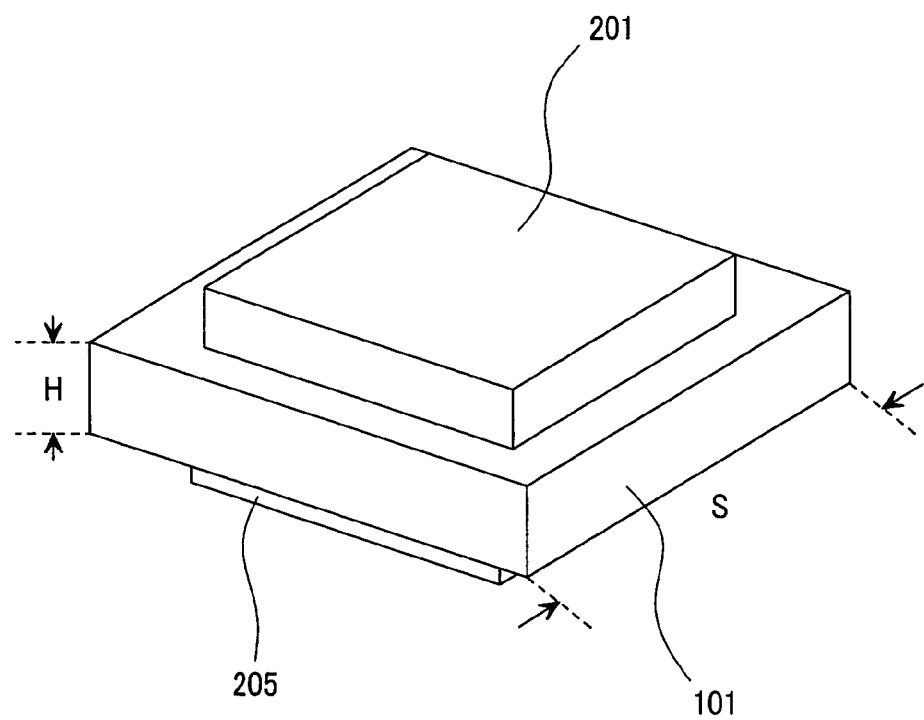
FIG. 3 shows a perspective view of an IC tag chip of the first embodiment.
Figure 4A:
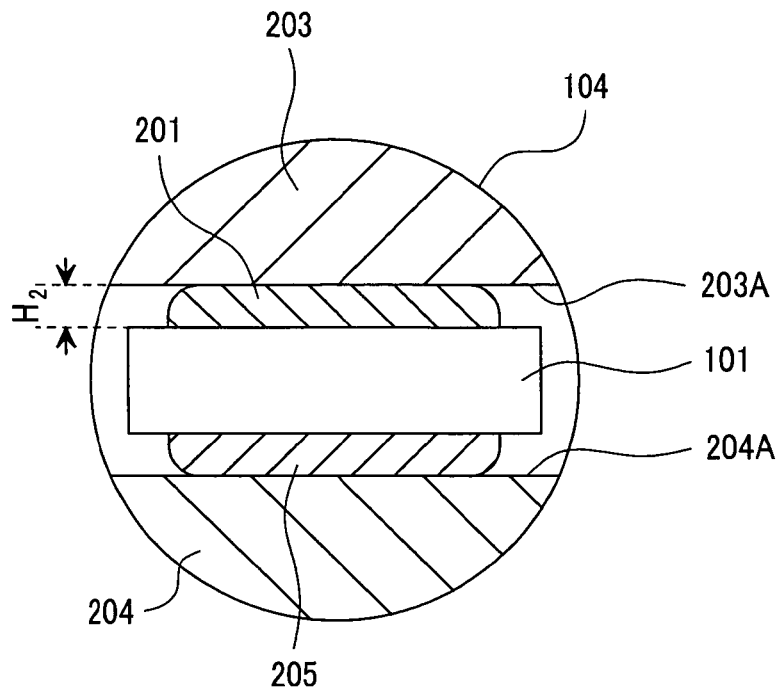
FIG. 4A is a drawing showing a sectional structure along the line C-C of FIG. 2.
Figure 4B:
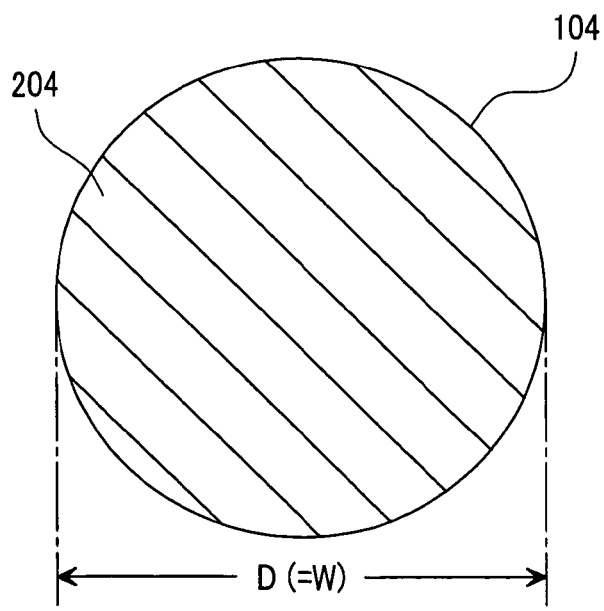
FIG. 4B is a drawing showing a sectional structure along the line E-E of FIG. 2.
Figure 5A:
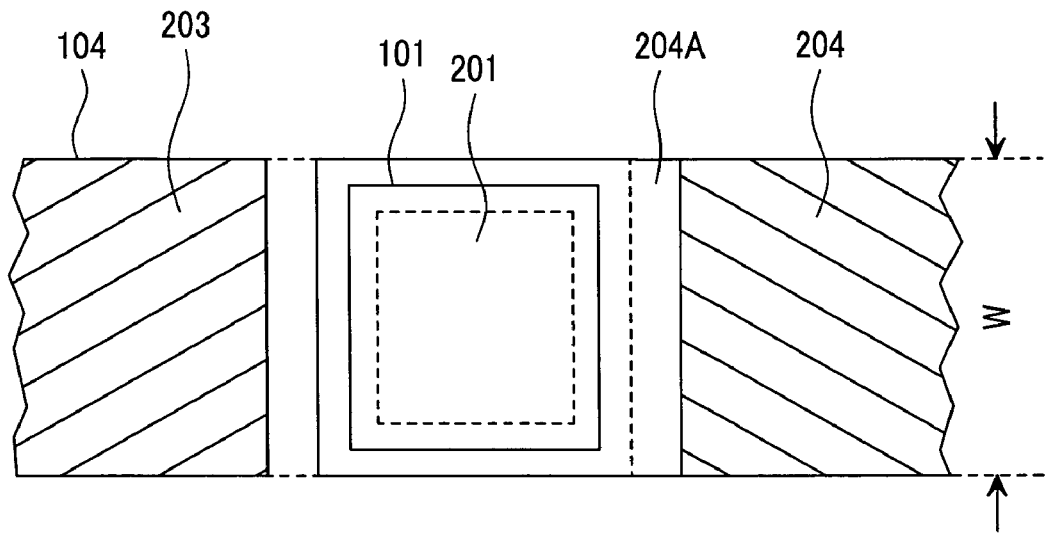
FIG. 5A is a drawing showing a sectional structure along the line F-F of FIG. 2.
Figure 5B:
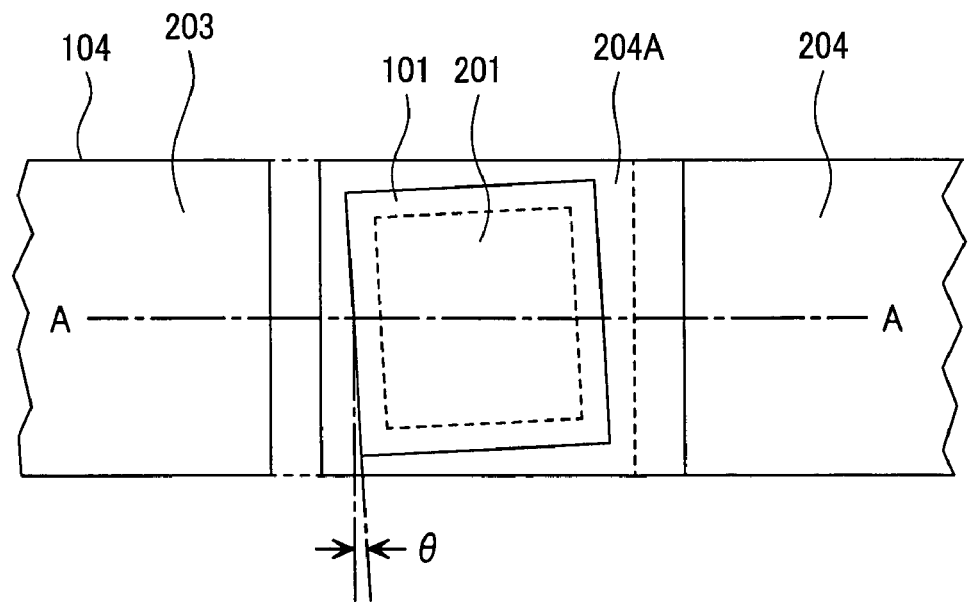
FIG. 5B is an explanatory drawing showing a sectional structure along the line F-F of FIG. 2.

FIG. 1 is a perspective view showing an enlarged connection part of an IC tag chip in the first embodiment of the present invention and an antenna. FIG. 2 shows FIG. 1 when viewed from symbol B, and shows a section of a portion in which the IC tag chip and the antenna are connected. FIG. 3 shows a perspective view of the IC tag chip of FIG. 1. A section taken along a line C-C of FIG. 2 is shown in FIG. 4A, which shows a section of the wireless IC tag in the IC tag chip portion. FIG. 4B shows a section taken along a line E-E of FIG. 2. FIG. 5A shows a section taken along a line F-F of FIG. 2. FIG. 5B is an explanatory drawing on manufacturing.

Hereinafter, detailed descriptions will be given.

The wireless IC tag 104 of the present invention comprises an IC tag chip 101 and a pair of antenna conductors 203 and 204 with circular sections connected to its electrodes. The pair of antenna conductors extends along a common axis with the IC tag chip 101 sandwiched (A direction of FIG. 1=an axial direction of the antenna), and constitutes a dipole antenna with a narrow width. Radio waves used in the wireless IC tag 104 are microwaves having a frequency of e.g., 2.45 GHz.

The IC tag chip 101 has a rectangular plane shape, and its surface and back surface are connected to a bump 201 and a bump 205 as electrodes, respectively, constituting a double-sided electrode IC tag chip. The bumps 201 and 205 are respectively connected to connection plane parts 203A and 204A provided in the ends of the antenna conductors 203 and 204. The bumps 201 and 205 are often made of gold plating but may be made of copper, aluminum, tungsten, and the like. Although the antenna conductors 203 and 204 are made of aluminum, copper, silver paste, or the like, they are not limited to these materials.

According to this embodiment, the IC tag chip 101 is completely sandwiched between connection plane parts 203A and 204A of the antenna conductors, and the whole wireless IC tag has a circular section.

Since the wireless IC tag is adhered to many products in an extremely wide range, a tremendous number of the wireless IC tags are used. Therefore, an economic, reliable structure is required. To economically produce the IC tag chip 101 being a semiconductor chip and make it tolerant of stress such as bending, its size must be reduced.

The IC tag chip 101 has no power in itself and has a circuit structure of rectifying a microwave signal from a reader received in the antenna in a rectifying part and obtaining a power voltage. This structure makes the size and shape of the IC tag chip compact. For example, the plane shape of the IC tag chip 101 is a rectangular shape having a side length S of 0.3 mm, and its height H is 0.05 mm (see FIG. 3). The height H2 of the bumps 201 and 205 (see FIG. 4A) is about 0.01 to 100 microns.

The antenna conductors 203 and 204 comprise a metallic wire having a circular sectional shape. The wire is plastically processed to form substantially semi-circular plane parts for connection 203A and 204A in the ends of the antenna conductors. Accordingly, although the outer diameters of the antenna conductor ends plastically processed are not a circle of a uniform diameter unlike other portions of the antenna conductors, it is just one part of the whole, and as the antenna conductors, it has a substantially circular sectional shape.

The diameter D (=width W, see FIG. 4B) of the antenna conductors 203 and 204 connected to the IC tag chip 101 is subject to a constraint of 1.0 mm or less, preferably 0.5 mm or less to prevent antennal interference of congestion control.

The present invention uses the terms of the width of a wireless IC tag or the width of an antenna. These terms denote a substantial maximum value of the widths of the antenna projected to radio waves from the reader. Therefore, the diameter D of the antenna conductors is one form of the width of the antenna, and an antenna conductor having a diameter of 1.0 mm denotes an antenna having a width of 1.0 mm. Since the size (width S) of the IC tag chip 101 is equal to or less than the diameter D of the antenna conductor, usually, the width of the wireless IC tag and the width W of the antenna conductors are the same. However, when a wire of the extremely thin diameter of 0.001 mm is used, the size (width) of the IC tag chip 101 may be a little larger than that as the width of the wireless IC tag.

Normally, since the wireless IC tag is adhered to various products and is read in an unspecific state of a reading pattern such as during transportation, the wireless IC tag is often read from the reader in a state of various rotations. According to this embodiment, since the sectional shape of the antenna conductors is circular and the diameter D is small, the reader can correctly read identification information regardless of the posture of the wireless IC tag.

The length of the antenna in the axial direction (A direction of FIG. 1) does not need to be subjected to special limitations because it may be different depending on application fields of a desired wireless IC tag. Generally, about half the wavelength of a frequency band used is often used. For example, in a frequency band of 2.45 GHz, ½-wavelength is 61.2 mm, but an antennal is somewhat shorter than this because of the influence of a dielectric constant of an insulation material used as a base material. In a frequency band of 5.12 GHz, ½-wavelength is 29.3 mm, but an antennal is somewhat shorter than this because of the influence of a dielectric con-stant of an insulation material used as a base material. However, practically, the present invention is not limited to these antenna lengths.

In this embodiment, the bump 201 and the antenna conductor 203, and the bump 205 and the antenna conductor 204 are respectively connected to ultrasonic connection faces 202 and 206, using ultrasonic waves. According to this example, heat resistance is excellent because the IC tag chip 101 and the antennas are connected on the ultrasonic connection faces.

Since only one of each of the bump 201 and the bump 205 exists on each of the upper and lower planes of the IC tag chip 101, electrodes of a large area can be formed on the respective planes. Therefore, the need to secure height is not so required. Accordingly, the height of the bumps can be made lower as far as edge short circuit does not occur in the semiconductor chip constituting the IC tag chip 101, so that an economic IC tag chip can be formed.

The double-side electrode IC tag chip 101 having the upper and lower planes is extremely effective also for the purpose of mounting a large number of IC tag chips at the same time. This contributes to a significant reduction in assembly, connection, and assembly manpower in comparison with aligning small IC tag chips by picking them up one at a time by tweezers.

This is particularly effective when the size and shape of an antenna are small, and particularly effective for an antenna tolerant of congestion control of the present invention, that is, an antenna narrow in width W. That is, as the width of the antenna conductors 203 and 204 becomes smaller, connection terminals of the antenna also become smaller for terminals of the IC tag chip 101. However, in the case of a double-sided electrode chip, since electrodes of a large area can be formed on the respective planes, alignment free of influence on rotation becomes simple. These points are described with reference to FIGS. 5A and 5B.

FIG. 5A shows connection portions of the IC tag chip 101 of the wireless IC tag 104 and the right and left antenna conductors when viewed from above. This drawing shows that the IC tag chip 101 of this embodiment is structured to be sandwiched by the right and left antenna conductors 203 and 204 (width W). Moreover, FIG. 5A shows that the bump 201 of the IC tag chip is shaped to cover most of the surface of the IC tag chip 101.

The bump 201 and the bump 205 on the upper and lower planes of the IC tag chip 101 are electrodes of the IC tag chip, and connection terminals of the antenna conductors. The antenna conductors 203 and 204 are connected to these bumps. In this embodiment, the IC tag chip 101 is formed to enter the section of a thin circular antenna. In such a state, the overall sectional shape of the wireless IC tag 104 is circular, and the surface of the antenna has no bump. As a result, the antenna can be expected to be extremely convenient in handling.

The existence of the electrodes 201 and 205 on both sides of the IC tag chip 101 shows that a symmetric structure is possible. By this structure, during assembly and connection, there is no need to check front and back faces of the wireless IC tag, the IC tag chip can be easily disposed on a neutral plane of the antenna, and a wireless IC tag tolerant of stress such as bending can be provided.

Since the IC tag chip is expected to become as small as 10 microns square, the bumps 201 and 205 serving as antenna connection terminals must be shaped to have a maximum area close to the chip size. For this reason, rather than disposing two bumps on one side of the chip, it is extremely important to dispose one bump on each of the both sides in terms of securing a sufficient bump area and curbing rigidity.

Furthermore, to dispose one bump on each of the both sides is important to connect an antenna narrow in antenna width for satisfactorily performing narrow congestion control to the chip. Specifically, when the wireless IC tag 104 is viewed from the top, the IC tag chip 101, and the antenna conductors 203 and 204 are disposed in alignment in the axial direction A of the wireless IC tag 104, and are connected to the bumps, one on each of the both sides. Since the plane parts for connection 203A and 204A provided in the ends of the antenna conductors have sufficient areas for the bumps, as shown in FIG. 5B, in a plane direction, even if the IC tag chip 101 rotates by a given angle θ on the plane parts for connection 203A and 204A, an electrically satisfactory connection relation can be maintained between the IC tag chip 101, and the antenna conductors 203 and 204. Accordingly, the rotation of the IC tag chip 101 exerts no influence on the operation of the wireless IC tag.

Figure 6:
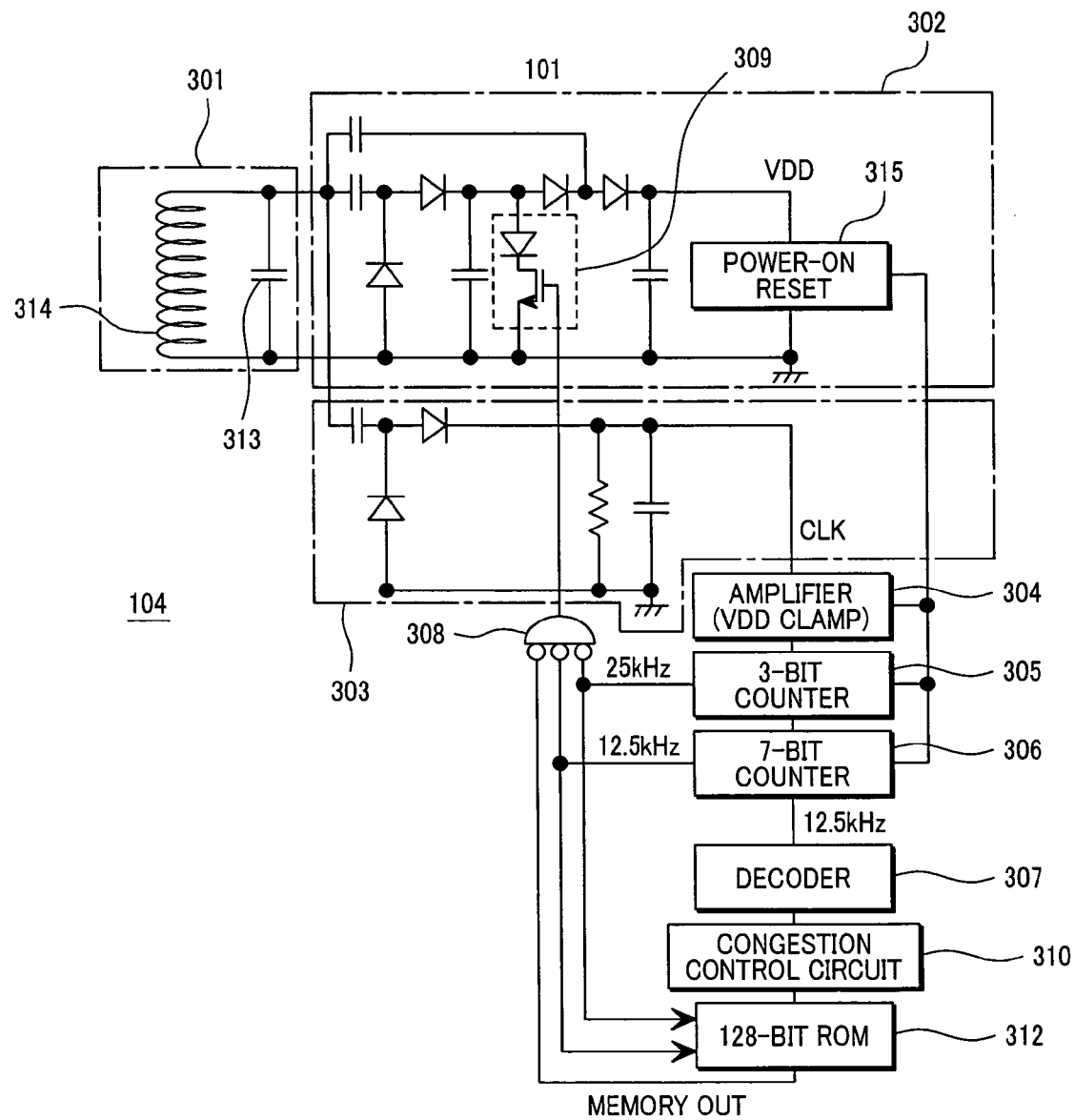
FIG. 6 is a drawing showing a circuit configuration of an IC tag chip of the present invention.

FIG. 6 shows a circuit configuration of the IC tag chip 101 having an identification number according to this embodiment. The circuit shown in the drawing is a transceiver by which the wireless IC tag communicates with a remote reader, using microwaves. An antenna part is shown by an equivalent circuit.

The IC tag chip 101 comprises: an antenna part 301; a rectifying circuit 302 connected to the antenna part; a clock extracting circuit 303 connected to the rectifying circuit 302; a logical circuit; a congestion control circuit 310; and a read-only memory 312 into which information such as an identification number and a product name is written.

The antenna part 301 includes an antenna 314 that forms a resonance circuit along with a capacitor 313. The rectifying circuit 302, which functions as a power circuit, includes a power-on reset circuit 315 that rectifies a microwave signal from a reader (interrogator) 401 received in the antenna 314 by a high voltage to obtain a power voltage VDD, and outputs a power voltage VDD when the power voltage VDD has become a proper voltage.

The IC tag chip 101 further comprises: a modulator 309 that modulates a received microwave signal; a demodulation circuit 303 that demodulates an amplitude-modulated microwave signal to extract a clock signal CLK; an amplifier (VDD clamp) 304 that amplifies a clock signal CLK; a 3-bit counter 305 that frequency-divides a clock signal CLK into a 25-kHz clock signal; a 7-bit counter 306 that further frequency-divides that signal into a 12.5-kHz clock signal; a read-only memory 312 described in detail later into which information such as an identification number and a product name is written; a decoding circuit (decoder) 307 for reading out the contents of the memory 312 one bit at a time; and a gate circuit 308 that outputs memory OUT outputted from the memory 312 in a predetermined timing.

The modulator 309 receives memory OUT outputted from the gate circuit 308 and modulates a microwave signal. The respective circuits to constitute a logical circuit such as the counter 305 are realized by a CMOS logical circuit with an NMOS transistor and a CMOS transistor combined.

An identification number included in the read-only memory 312 consists of plural bits. In this embodiment, 128 bits are adopted. The 128 bits allow combinations of the 128th power of 2. This number of bits enables free designs and variable structures, depending on application fields.

Figure 7:
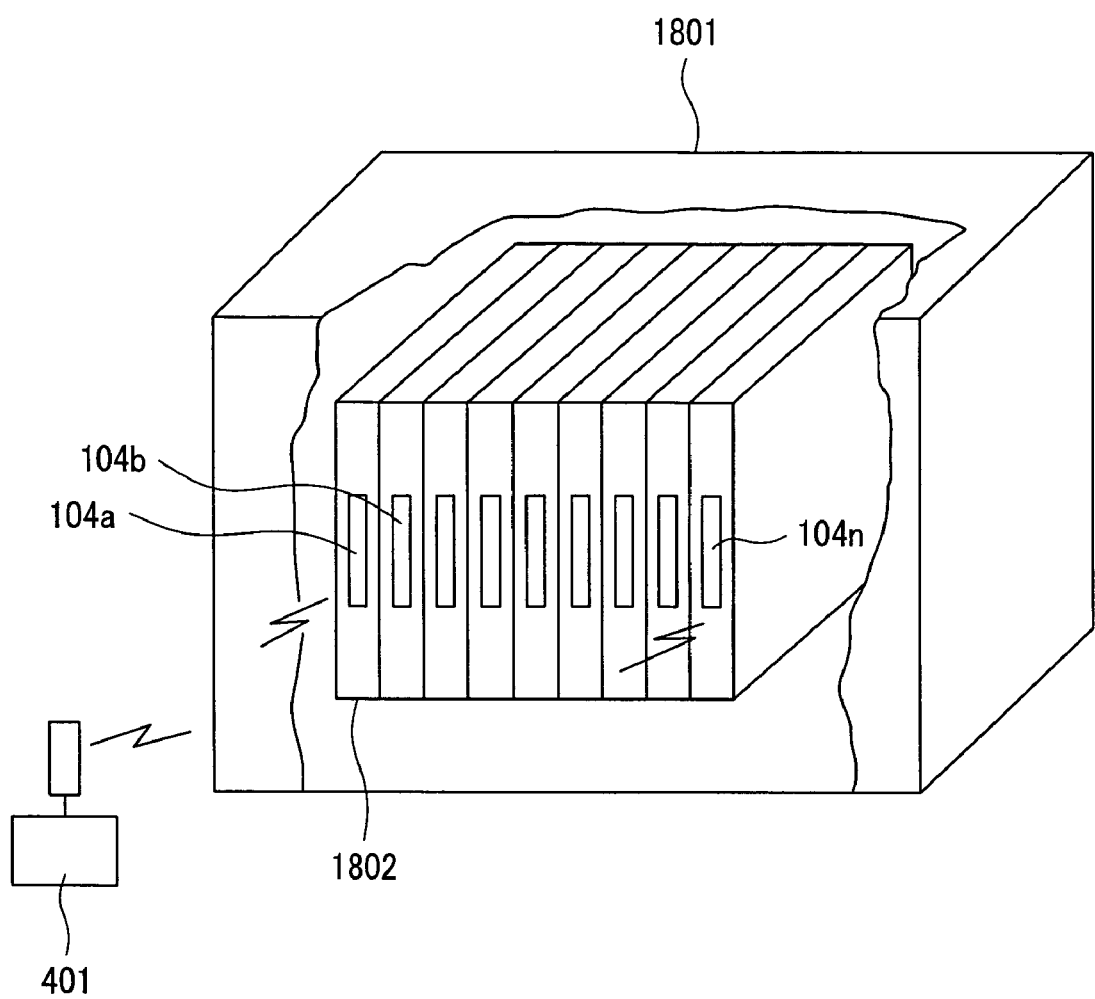
FIG. 7 shows an example of a configuration when wireless IC tags of the present invention are used.

FIG. 7 shows an example of a situation in which wireless IC tags of the present invention are used. Plural wireless IC tags 104 (104a to 104n) are adhered to compact cartridges 802 in an optically shielded carton 810. The wireless IC tags 104 send an identification number for an inquiry of an identification number by congestion control from the reader 401. As a result, without opening the carton 803, the respective cartridges in the carton are individually identified, and the carton is effectively used when product information is acquired. Even in unspecific reading forms such as a state in which the wireless IC tags 104 rotate in various forms for the reader 401, correct reading from the reader is enabled.

The congestion control circuit 310 comprises logical control circuits, and for an inquiry of an identification number from the reader 401, sends the identification number by a predetermined algorithm. As an algorithm of congestion control, for an inquiry from the reader 401, plural wireless IC tags 104 send one bit at a time from the beginning of an identification number, and the reader 401 determines whether the bit is High or Low. The reader sends High or Low to the respective wireless IC tags 104, and wireless IC tags 104 that output High stop subsequent response. This algorithm is referred to as a binary search method.

Alternatively, the wireless IC tags 104 have a predetermined random number generation algorithm, and for an inquiry from the reader, the wireless IC tags 104 generate random numbers by an internal identification number, and send identification numbers according to the sequence of the random numbers. If the identification numbers are duplicate, they again generate random numbers and send identification numbers according to the sequence of the random numbers. This algorithm is referred to as a time slot method.

The congestion control circuit 310 controls these algorithms. A signal from the congestion control circuit 310 is inputted to the gate circuit 308, and the impedance of the rectifying circuit 302 is changed by the gate circuit 308 and appears as a physical phenomenon due to a change of a radio wave reflection factor of the antenna 301. As a result, the reader 401 can correctly observe the status of the respective wireless IC tags synchronously with a clock signal from the reader.

Figure 8B:
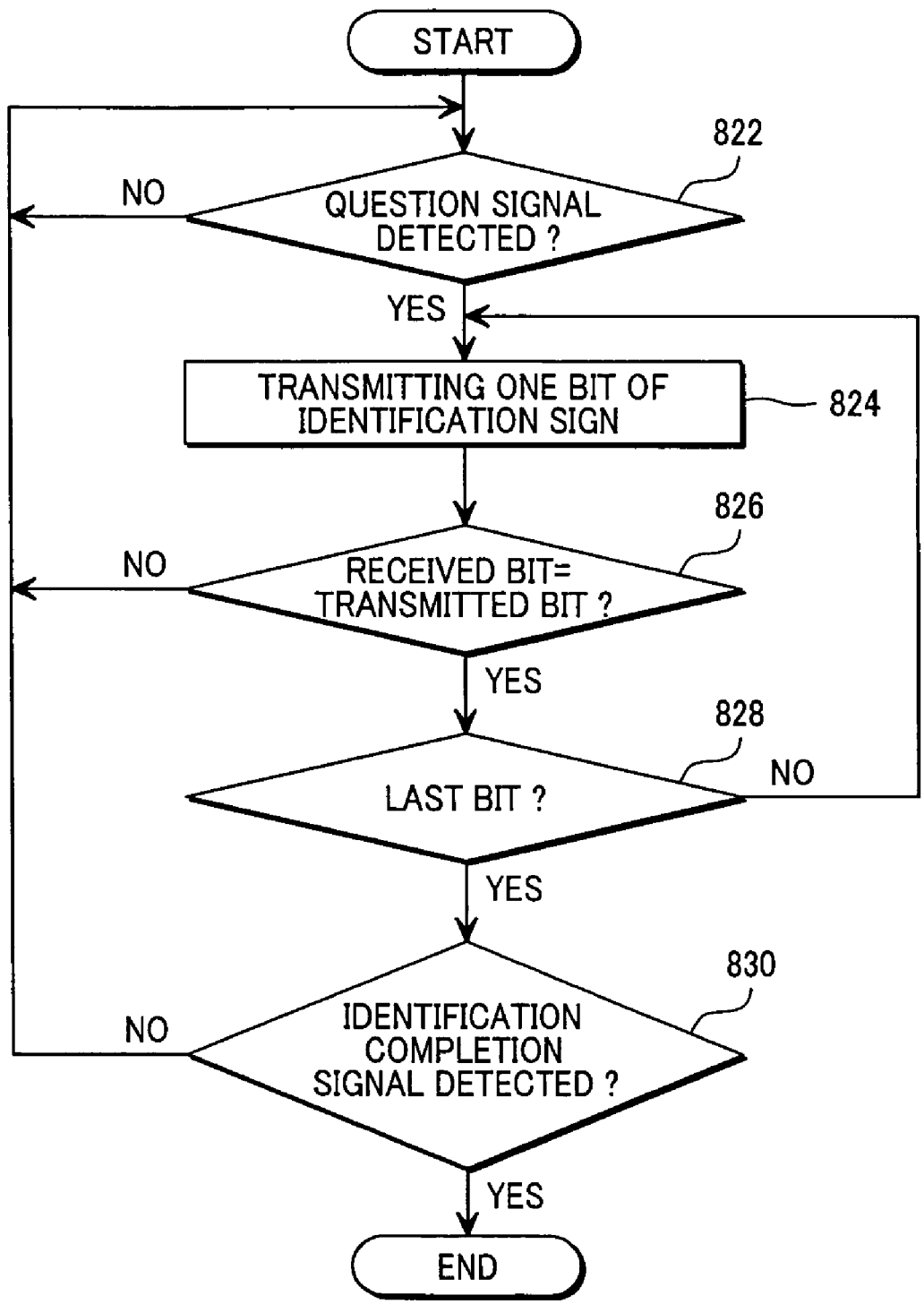
FIG. 8B is a drawing showing an operation procedure of a congestion control circuit in wireless IC tags.

FIGS. 8A and 8B are specific examples of congestion control algorithms. The reader 401 selects one wireless IC tag from plural wireless IC tags, and transfers sensor data to the reader 401 from the selected wireless IC tag.

FIG. 8A is a drawing showing the operation procedure of a congestion control circuit (not shown) of the reader 401. When the reader 401 identifies one wireless IC tag from plural wireless IC tags 104a, 104b, - - - , 104n within a communication area of the antenna, and receives its data, the reader 401 transmits a question command to the wireless IC tags 104a, 104b, - - - , 104n within the communication area via the antenna (S802).

When the wireless IC tags receive the question command of the reader, an identification sign unique to the respective wireless IC tags is transmitted to the reader only one bit. When the reader 401 detects transmission signals from the wireless IC tags (S804), it returns a received bit to the wireless tags (S806). The wireless IC tags receive the returned bit, and transmit the next one bit of the identification sign to the reader. The reader counts the number of received bits to determine whether a received bit is the last bit of an identification sign (S808). When the received bit is the last bit of an identification sign, the reader returns an identification completion signal to the wireless tags to notify them of correct reception (S810). The identification signal of the identified wireless tag is outputted (S812), and the processing terminates.

On the other hand, FIG. 8B shows an operation procedure of the congestion control circuit 310 in the wireless IC tags 104. When the congestion control circuit 310 that has received a question command from the reader 401 detects the question command from the reader 401 (S822), it transmits only one bit of an identification sign unique to the respective wireless IC tags to the reader (S824). The wireless IC tags 104 wait for a reply from the reader 401, and when they receive one bit of the identification sign, the congestion control circuit 310 compares it with one bit of the identification sign already transmitted. When the received bit and the transmitted bit do not match, because of failure in identification, it waits for a next question command (S826). When the received bit and the transmitted bit match, it determines whether the bit is the last bit (S828), and otherwise transmits a next bit. When the bit is the last bit, it waits for the transmission of an identification completion signal from the reader 401, and when detecting the identification completion signal, terminates the identification operation because of success in identification (S830).

According to the present invention, the antenna is a dipole antenna with a narrow width including a pair of antenna conductors connected to the IC tag chip. Radio waves used for communication between the reader and the IC tag chip are microwaves. By this construction, wireless IC tags tolerant of interference are obtained. This point is described below.

The IC tag chip has no power in itself and is compact in size, as described above. On the other hand, to make the IC tag chip usable in various applications, a sufficient communication distance must be secured.

Figure 9:
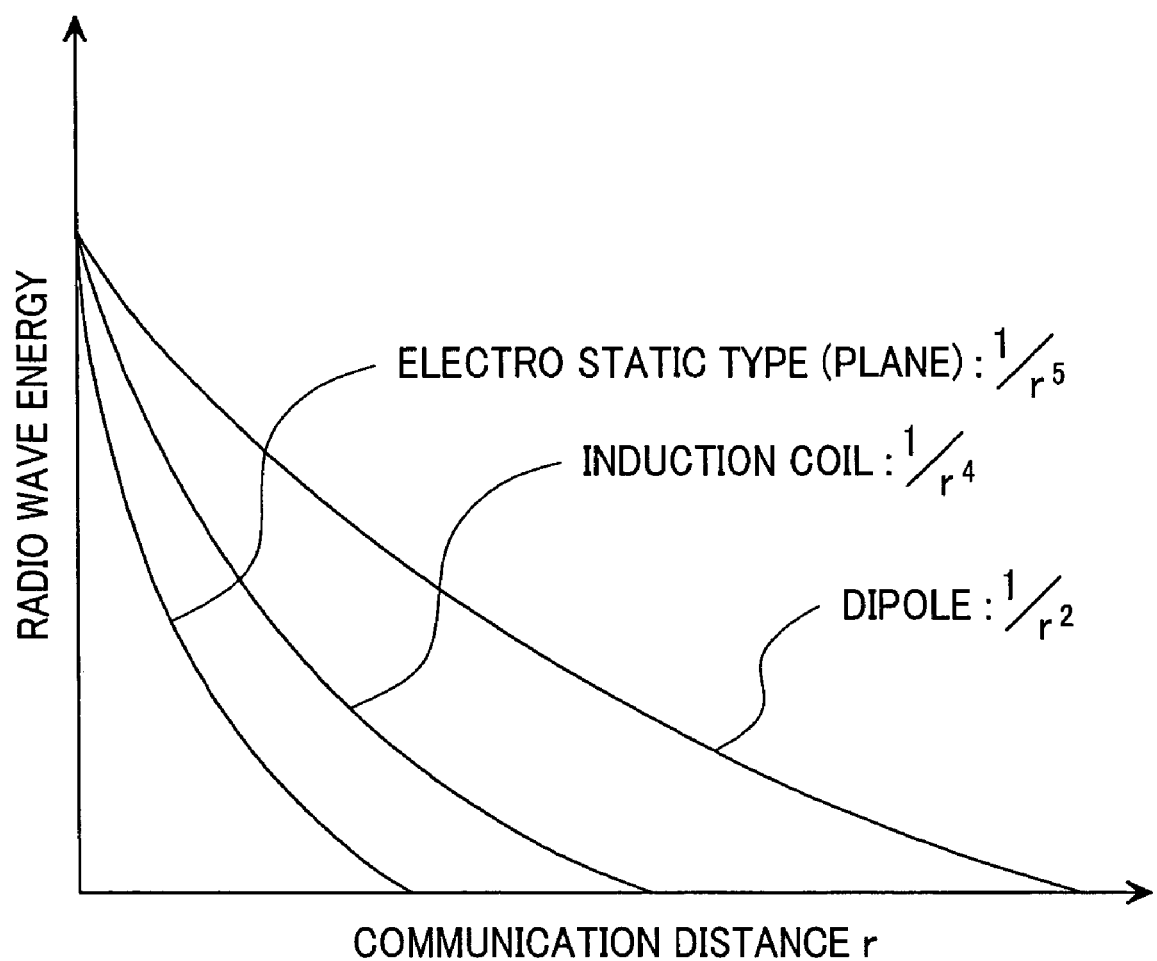
FIG. 9 is a drawing showing the relation between radio wave energies and communication distances in each of types of radio waves.

FIG. 9 is a drawing showing the relation between radio wave energies and communication distances in each of types of radio waves. For the same radio wave energy, electrostatic-type and induction-coil-type antennas are short in communication distance r. In the present invention, a dipole antenna is used and microwaves are used for communication, and thereby a sufficient communication distance can be secured despite a small amount of radio wave energy.

To make the IC tag chip usable in various applications, wireless IC tags must be tolerant of radio wave interference. That is, depending on environments in which the wireless IC tags are used, plural wireless IC tags exist in electromagnetic waves from the reader. Therefore, when the antennas of the respective wireless IC tags approach, the shade of radio waves develops, possibly exerting a great influence on reading of adjacent tags. Moreover, when the antennas of the respective wireless IC tags approach, because of interference, some wireless IC tags may be read from the reader but other wireless IC tags may not be normally read. This is because, since the reader observes the reflection factor of the antennas of the wireless IC tags, a large size of the antennas causes the reflection factor to become highly high and exerts a great influence on reading of adjacent tags.

The present inventors found out that there is a fixed relation between frequency bands of radio waves used for communication, the width of an antenna, and communication distances from the standpoint of the shade and reflection of radio waves.

Specifically, although the reader sends out electromagnetic waves to plural wireless IC tags, it observes impedance changes in the antennas of the respective wireless IC tags to read an identification number in the wireless IC tags. The impedance changes are transferred to the reader in combination with characteristic changes in adjacent antennas. A wide antenna width would cause a great change in space impedance, fluctuation of resonance frequencies, broader impedance changes of the antenna, and reduction in communication distances because of susceptibleness to radiation influence of adjacent antennas. Conversely, a narrow antenna width can expect reverse effects of them. Therefore, it is effective to narrow antenna width in a wireless IC tag of congestion control.

Figure 10:
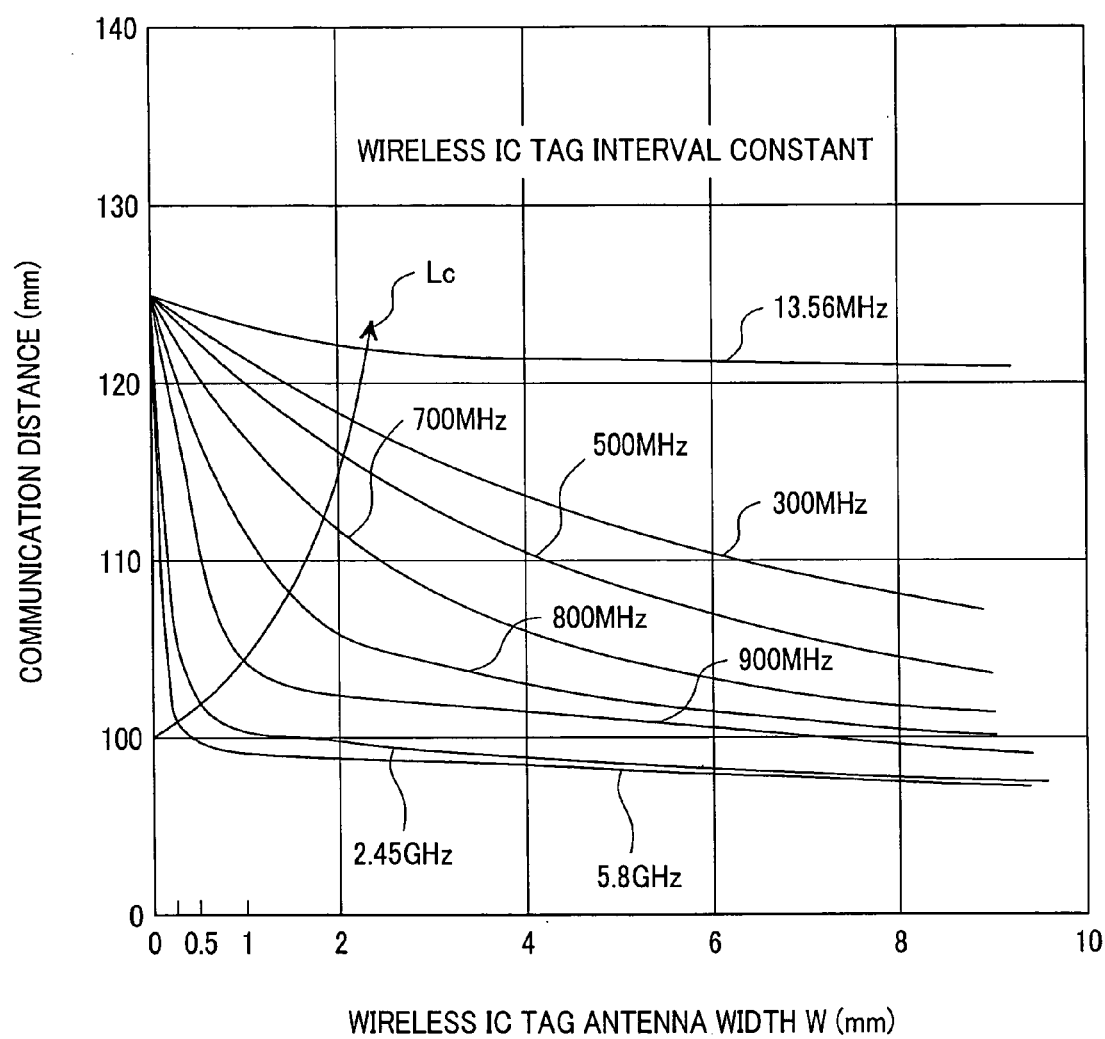
FIG. 10 is a drawing showing the relation between frequency bands of radio waves used for communication and the width of an antenna.

FIG. 10 shows the relation between frequency bands of radio waves used for communication and the width of an antenna. That is, it shows the characteristics of communication distances when an interval between two wireless tags is fixed with antenna width W as a parameter, for each frequency band.

When the wavelength of radio waves is long, the shade of radio waves is hardly problematic, and a wide width of wireless IC tags would hardly exert a great influence in communication distances. On the other hand, when the wavelength of radio waves is short like that of microwaves, the shade of radio waves has a great influence, and the width of wireless IC tags greatly influences communication distances.

Figure 12:
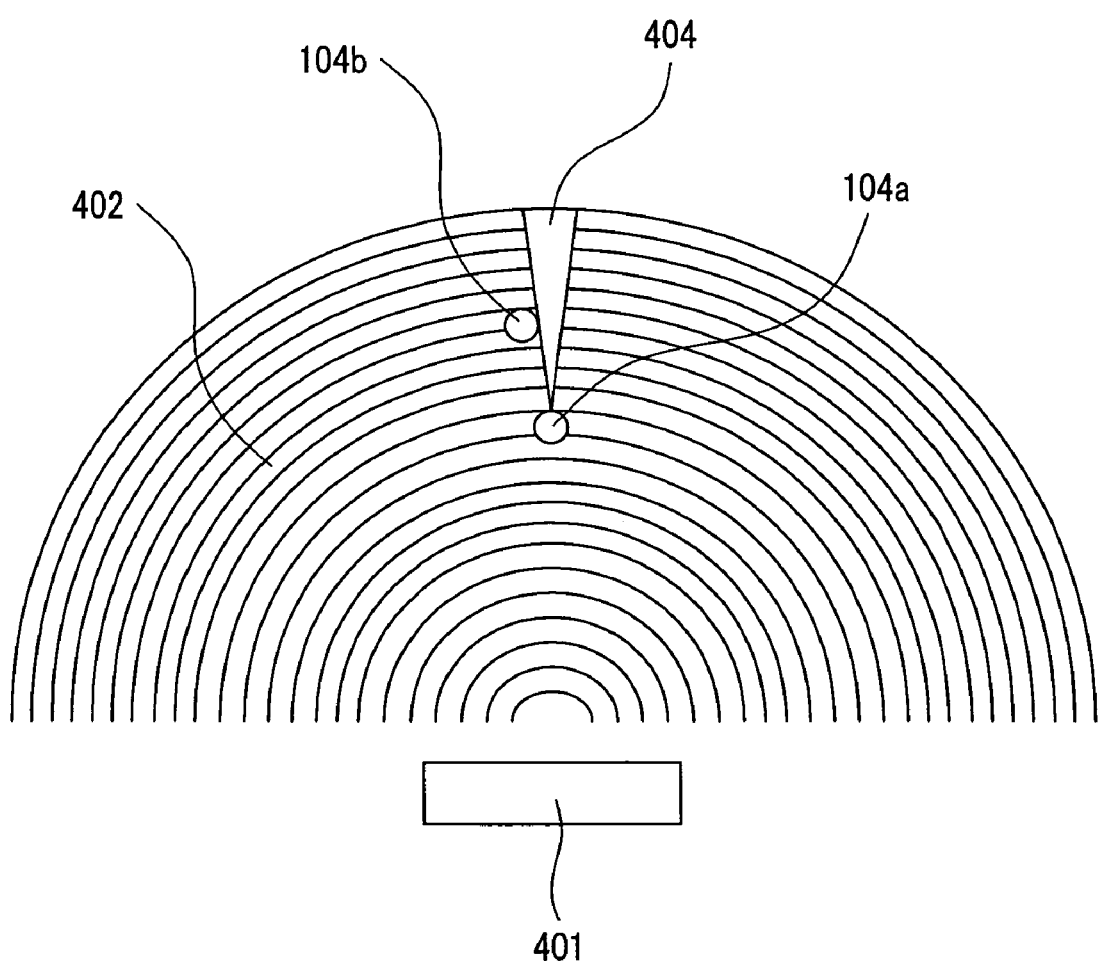
FIG. 12 is a drawing for explaining effects by an antenna of the present invention.

FIG. 12 shows an example of a wireless IC tag 104 with a circular section communicated over microwaves with high straight traveling performance. Even when plural wireless IC tags with a narrow antenna width exist in a narrow range, the range of a radio shade 404 of the wireless IC tag 104a of electromagnetic waves 402 emitted from the reader 401 is narrow. Therefore, the wireless IC tag 104b is not influenced for reading by the wireless IC tag 104a.

Figure 13A:
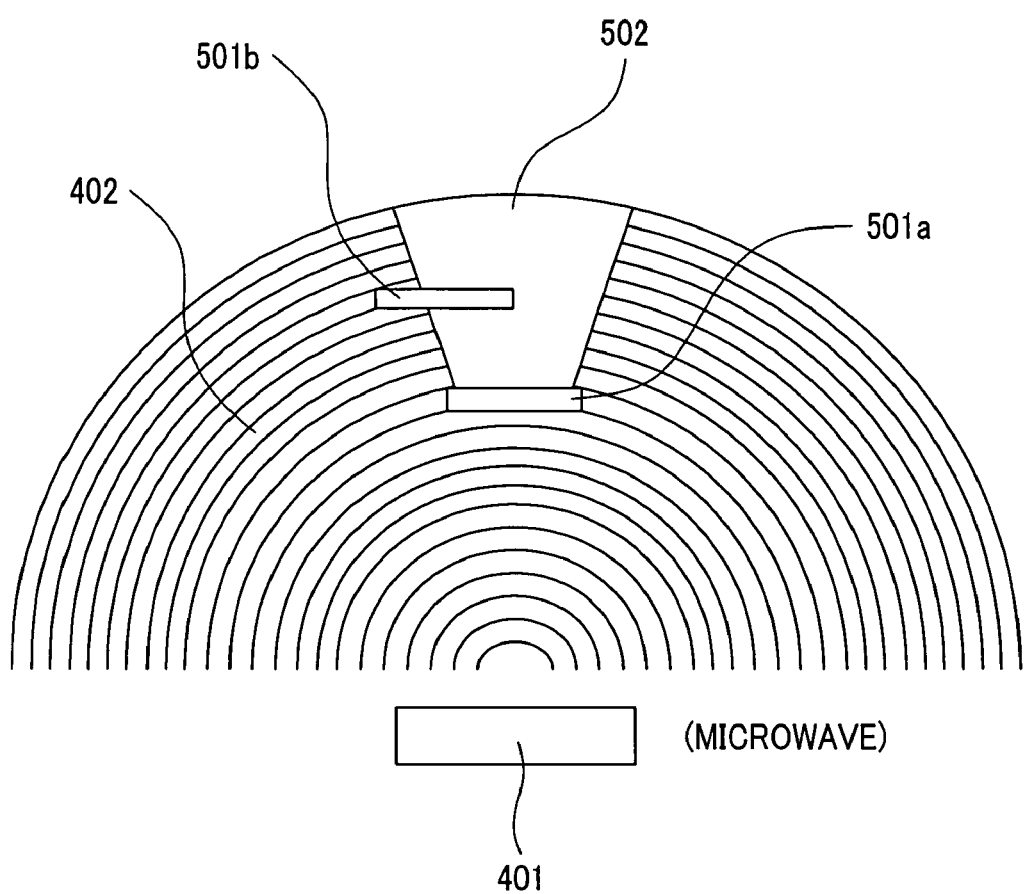
FIG. 13A is a drawing showing an example of interference by other antennas.

On the other hand, FIG. 13A shows an example of a wireless IC tag 501 with a wide antenna width communicated over microwaves. When plural wireless IC tags 501 with a wide antenna width exist in a narrow range, the range of a radio shade 502 of the wireless IC tag 501a of electromagnetic waves 402 emitted from the reader 401 becomes wide. Therefore, the wireless IC tag 501b is prone to be influenced for reading by the wireless IC tag 501a.

Figure 13B:
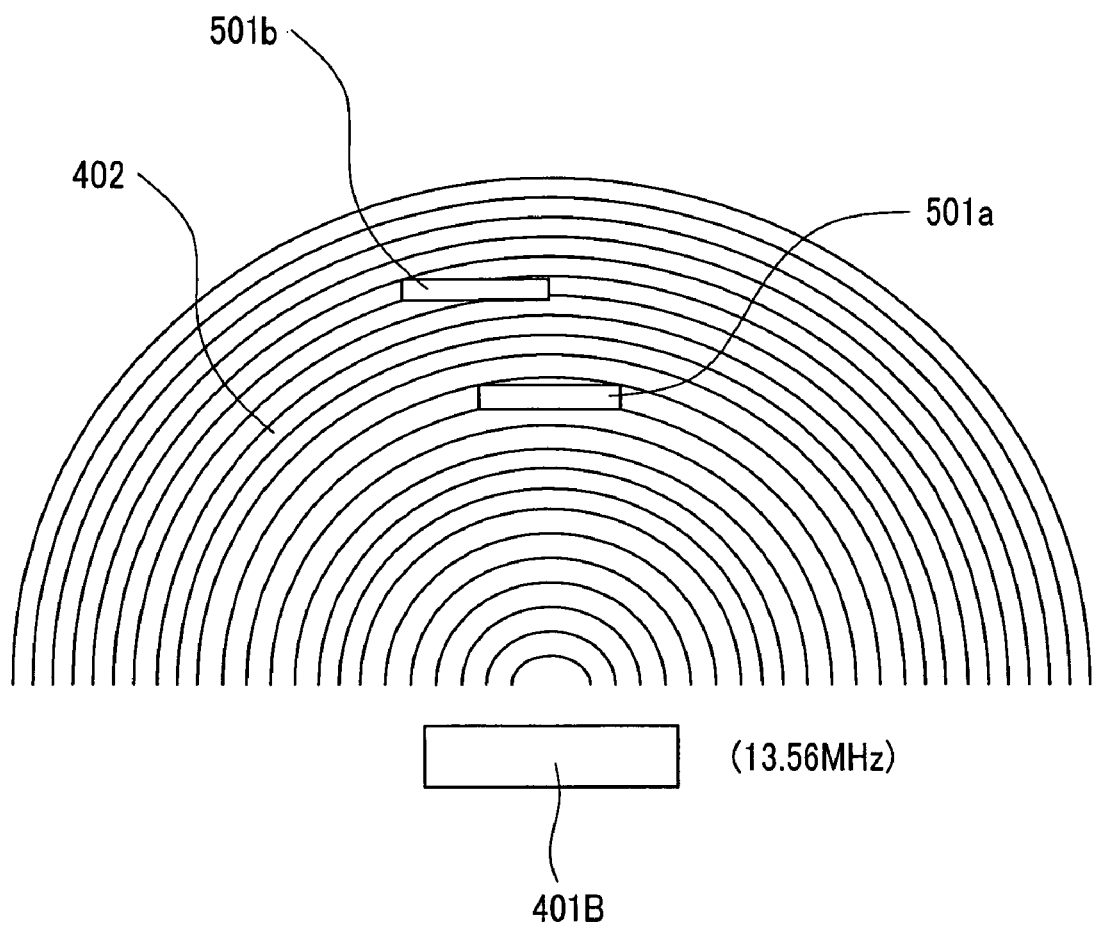
FIG. 13B is a drawing showing an example of interference by other antennas.

As shown in FIG. 13B, if the wavelength of radio waves used for communication is long, the influence of the shade of radio waves becomes smaller because of the roundabout of radio waves, and even when plural wireless IC tags (coils) 501 with a wide antenna width exist in a narrow range, they mutually exert no influence on reading.

Thus, there is a close relation between frequency bands of radio waves used for communication and influence by antenna width.

In the characteristics of communication distances, when the lower limit of an area in which a relatively large communication distance is obtained is defined as a communication distance critical point, a line Lc of FIG. 10 shows a communication distance critical point of each wavelength of radio waves. Preferably, the antenna width W is set in a left area with respect to the line Lc.

As an example, a communication distance critical point is 1.0 mm for UHF of 900 MHz, 0.05 mm for microwaves of 2.45 GHz, and 0.025 mm for microwaves of 5.8 GHz. Therefore, to minimize the influence of the shade of radio waves, it is desirable to set the antenna value W smaller than these values.

In this way, by reducing an antenna width, for example, by setting the antenna width below 0.05 mm for microwaves having a frequency of 2.45 GHz, communication can be performed with fewer errors during reading of plural wireless IC tags.

In other words, this phenomenon is effective only in environments in which communication is performed over radio waves short in wavelength, and wireless IC tags having a congestion control circuit are read. That is, in wireless IC tags having a congestion control circuit, their effectiveness is delivered by narrowing an antenna width.

Figure 11A:
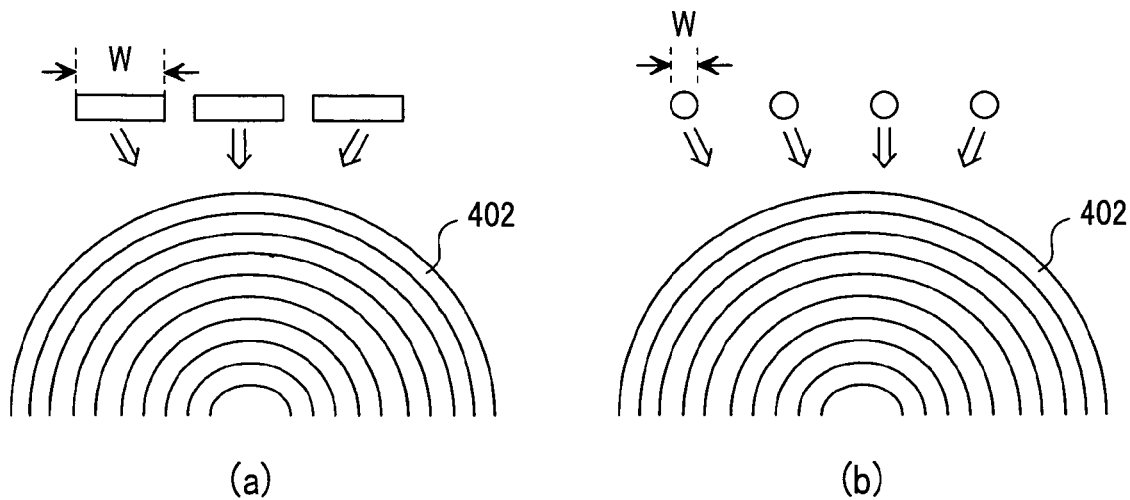
FIG. 11A shows the statuses of reflected waves when electromagnetic waves are emitted to plural wireless IC tags from a reader.

FIG. 11 shows the relation between the frequency bands of radio waves used for communication, antenna width, and interference amounts in wireless IC tags of congestion control. FIG. 11A shows the statuses of reflected waves when electromagnetic waves are emitted to plural wireless IC tags from the reader, wherein (a) shows reflected waves by an antennal with a wide width, and (b) shows reflected waves by an antennal with a narrow width of the present invention. A narrow antenna width is less sensitive to the influence of reflected waves. The influence of reflected waves depends on the frequency of radio waves; the higher the frequencies, the greater the influence by reflected waves.

Figure 11B:
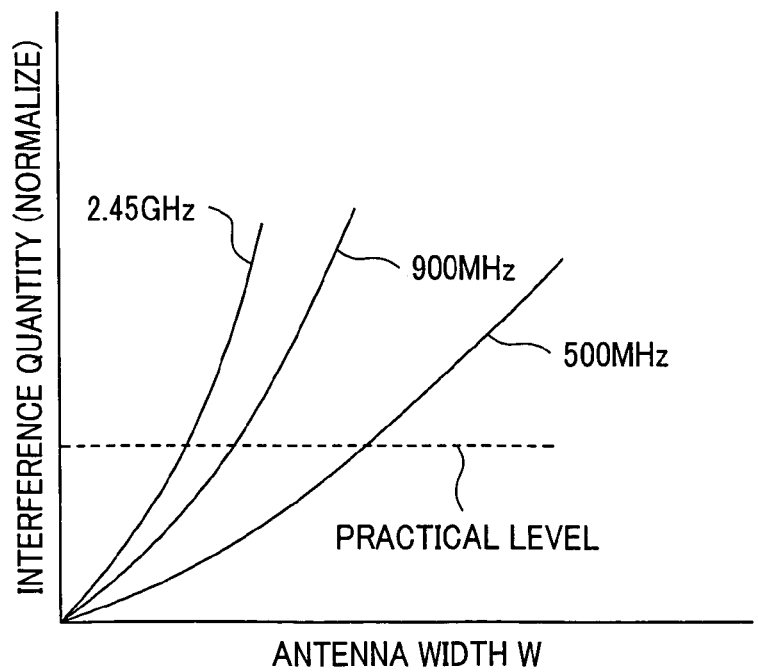
FIG. 11B shows the relation between frequencies and practical antenna widths W for allowable interference amounts.

FIG. 11B shows the relation between frequencies and practical antenna widths W for allowable interference amounts. The higher the frequencies, the narrow the practical antenna widths W. Therefore, also from the standpoint of interference amounts, it is effective to narrow an antenna width W in wireless IC tags of congestion control. Preferably, an antenna width is 10 mm or less for radio waves having a frequency of 900 MHz, 0.5 mm or less for 2.45 GHz, and 0.025 mm or less for 5.8 GHz.

The sectional shape of an antenna may be not only circular (already described) but also rectangular or elliptical. In any cases, when rotational use of a wireless IC tag is taken into account, the above-described relation needs to be satisfied in the largest portion of a projected antennal width.

A lower limit of an antenna width may be about one micron to meet an object of the present invention.

Narrowing an antenna width leads to reduction in the amount of use of an antenna material and provides a satisfactory effect in terms of cost efficiency and environmental loads.

Second Embodiment

Figure 14:
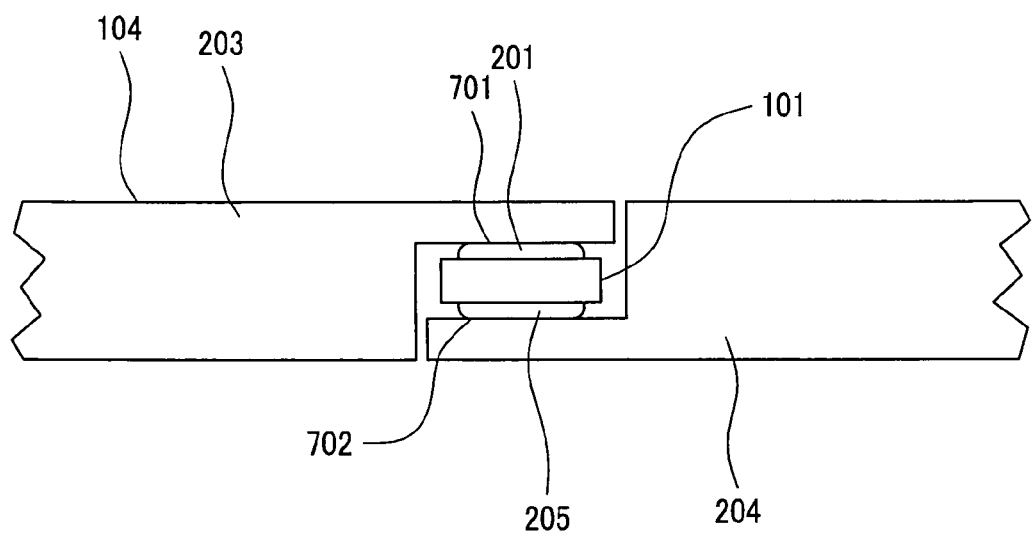
FIG. 14 is a drawing showing the sectional view of a wireless IC tag structure according to another embodiment of the present invention.

FIG. 14 shows a wireless IC tag of another embodiment of the present invention. The drawing shows the sectional view of a portion in which an IC tag chip and an antenna are connected. In this embodiment, the wireless IC tag 104 comprises an IC tag chip 101 and a pair of antenna conductors 203 and 204 with a circular section, connected to the electrodes of the IC tag chip 101. The pair of antenna conductors extends in an axial direction with the IC tag chip 10 sandwiched, and constitutes a dipole antenna with a narrow width. The bumps 201 and 205 are on the upper face and the lower face of the IC tag chip 101, respectively, and exist on both sides of the IC tag chip. The bumps are connected to the antennas 203 and 204. The antennas may have a rectangular or elliptical section. The maximum width of the antennas is equal to the maximum value defined in the case of projection, and its maximum value is 1.0 mm or less and its minimum value is one micron or more.

In this structure, the bump 201 and the antenna 203, and the bump 205 and the antenna 204 are connected to each other by an anisotropic conductive adhesive face 701, and an anisotropic conductive adhesive face 702, respectively. In this embodiment, since anisotropic conductive adhesives are used, the electrodes of the IC tag chip and the antennas can be easily connected.

Third Embodiment

Figure 15:
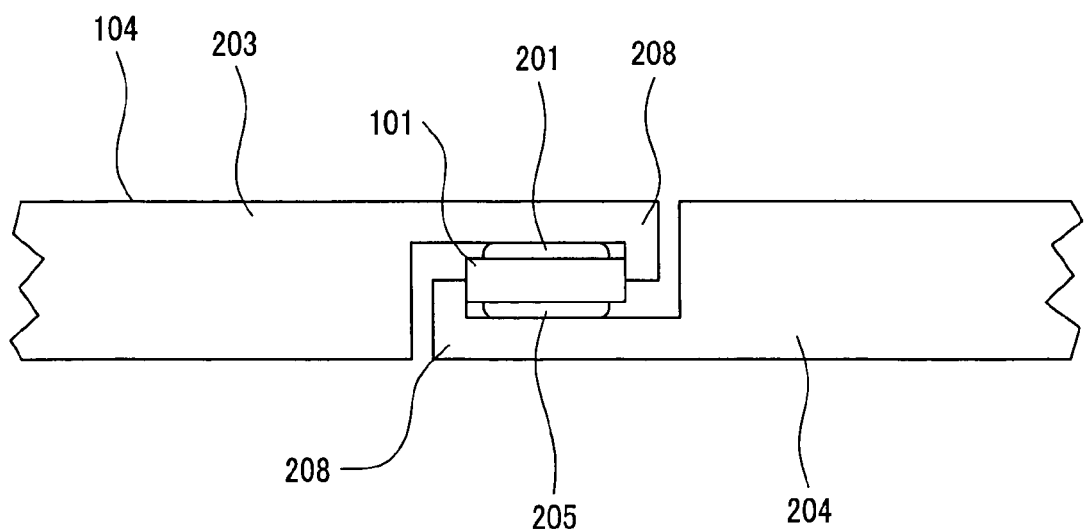
FIG. 15 is a drawing showing the sectional view of a wireless IC tag structure according to another embodiment of the present invention.

FIG. 15 shows a wireless IC tag according to another embodiment of the present invention. The drawing shows the sectional view of a portion in which an IC tag chip and an antenna are connected. In this embodiment, the wireless IC tag 104 comprises an IC tag chip 101 and a pair of antenna conductors 203 and 204 with a circular section, connected to the electrodes of the IC tag chip 101. The pair of antenna conductors extends in an axial direction with the IC tag chip 101 sandwiched, and constitutes a dipole antenna with an arrow width. The antennas 203 and 204 having antenna hooks 208 are connected to the bumps with the bumps 201 and 205 on the upper side and the lower side of the IC tag chip 101 and on both sides of the IC tag chip. The antennas may have a rectangular or elliptical section. The maximum width of the antennas is equal to the maximum value defined in the case of projection, and its maximum value is 1.0 mm or less and its minimum value is one micron or more.

In this structure, the bump 201 and the antenna 203, and the bump 205 and the antenna 204 are connected to each other by a ultrasonic or an anisotropic conductive adhesive. The existence of the antenna hooks 208 prevents the IC tag chip 101 from being disengaged from the antennas 203 and 204 even if the antennas are pulled.

Fourth Embodiment

Figure 16:
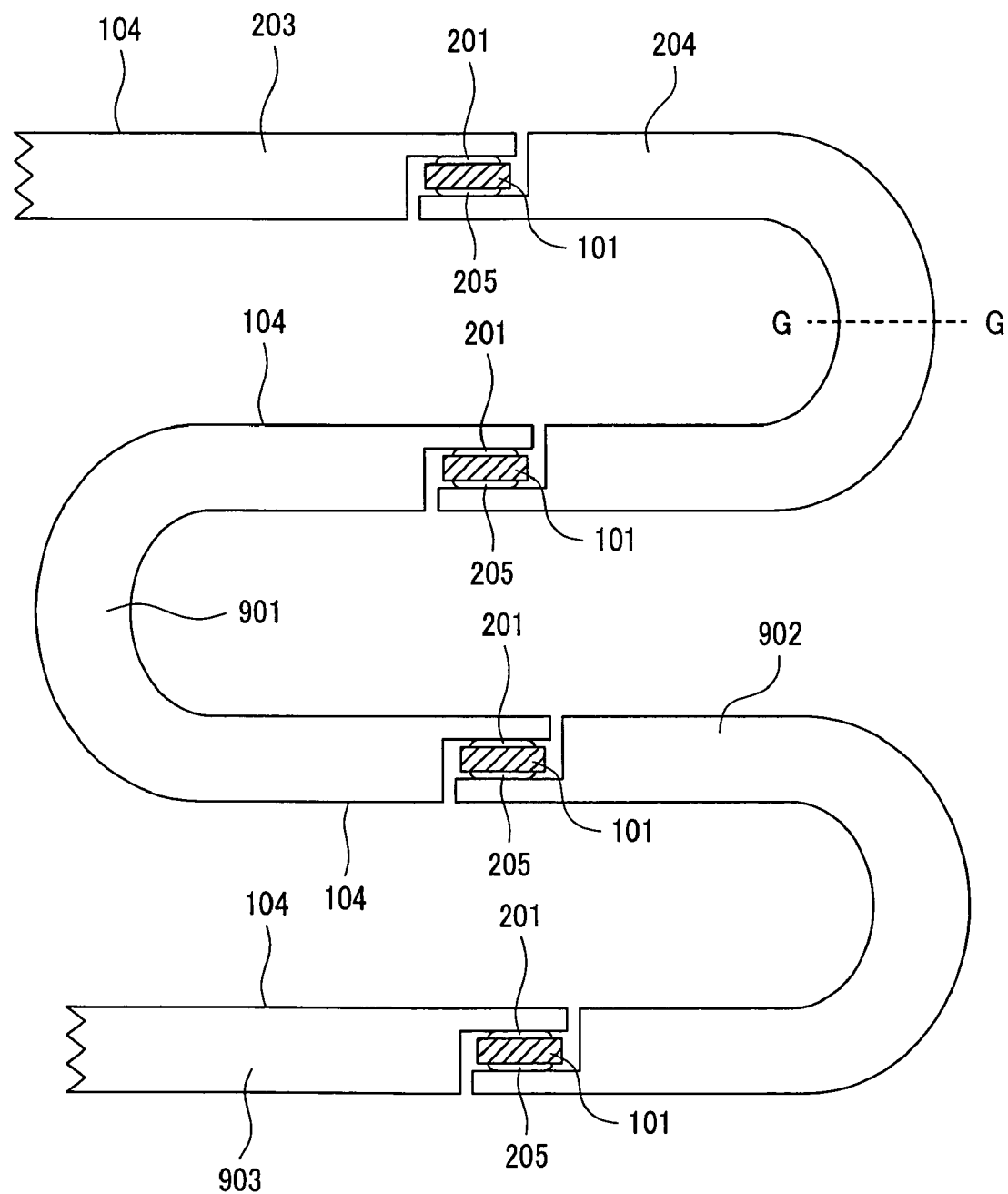
FIG. 16 is a drawing showing an assembly process example of a wireless IC tag of each embodiment of the present invention.

FIG. 16 shows a wireless IC tag according to another embodiment of the present invention. Since the wireless IC tag is widely adhered to various products, it must be inexpensively manufactured. The drawing shows wireless IC tags with a narrow antenna width continuously formed.

Also in this embodiment, the wireless IC tag 104 comprises the IC tag chip 101 and a pair of antenna conductors, connected to its electrodes. The pair of antenna conductors extends with the IC tag chip 101 sandwiched, and constitutes a dipole antenna with a narrow width. Like the first to third embodiments, the IC tag chips 101 are sandwiched via bumps. However, unlike the first to third embodiments, the IC tag chips 101 are connected to each both ends of the antenna conductors 203, 204, 901, 902, and 903. In other words, the antenna conductors 203, 204, 901, 902, and 903 at least have a length corresponding to two sets of adjacent wireless IC tags.

By taking such a form, plural sets of wireless IC tags each comprising an IC tag chip and thin antennas can be continuously produced, and wireless IC tags for performing congestion control can be economically produced and supplied. The double-sided electrode IC tag chip 101 having upper and lower planes are extremely effective for the purpose of mounting a large number of IC tag chips in antennas at the same time.

Although handling wireless IC tags of thin antennas generally requires a carrier such as tape, in this embodiment, since thin antennas themselves exist continuously while having a function of a tape carrier, no tape carrier is required.

When this continuous wireless IC tag is adhered to products, one set of a wireless IC tag, that is, one IC tag chip 101 and a pair of antenna conductors with a circular section, connected to its electrodes is cut as a unit to adhere to a product, enabling simple handling. If the maximum width of a thin antenna is 1.0 mm or less, preferably 0.5 mm or less, the wireless IC tag wound in a large amount does not turn into a large volume and a large amount of the wireless IC tag can be housed in a small volume, simplifying handling. It is a good idea to mark the antenna conductor 204 in a line G-G in advance as a cut position.

Fifth Embodiment

Figure 17:
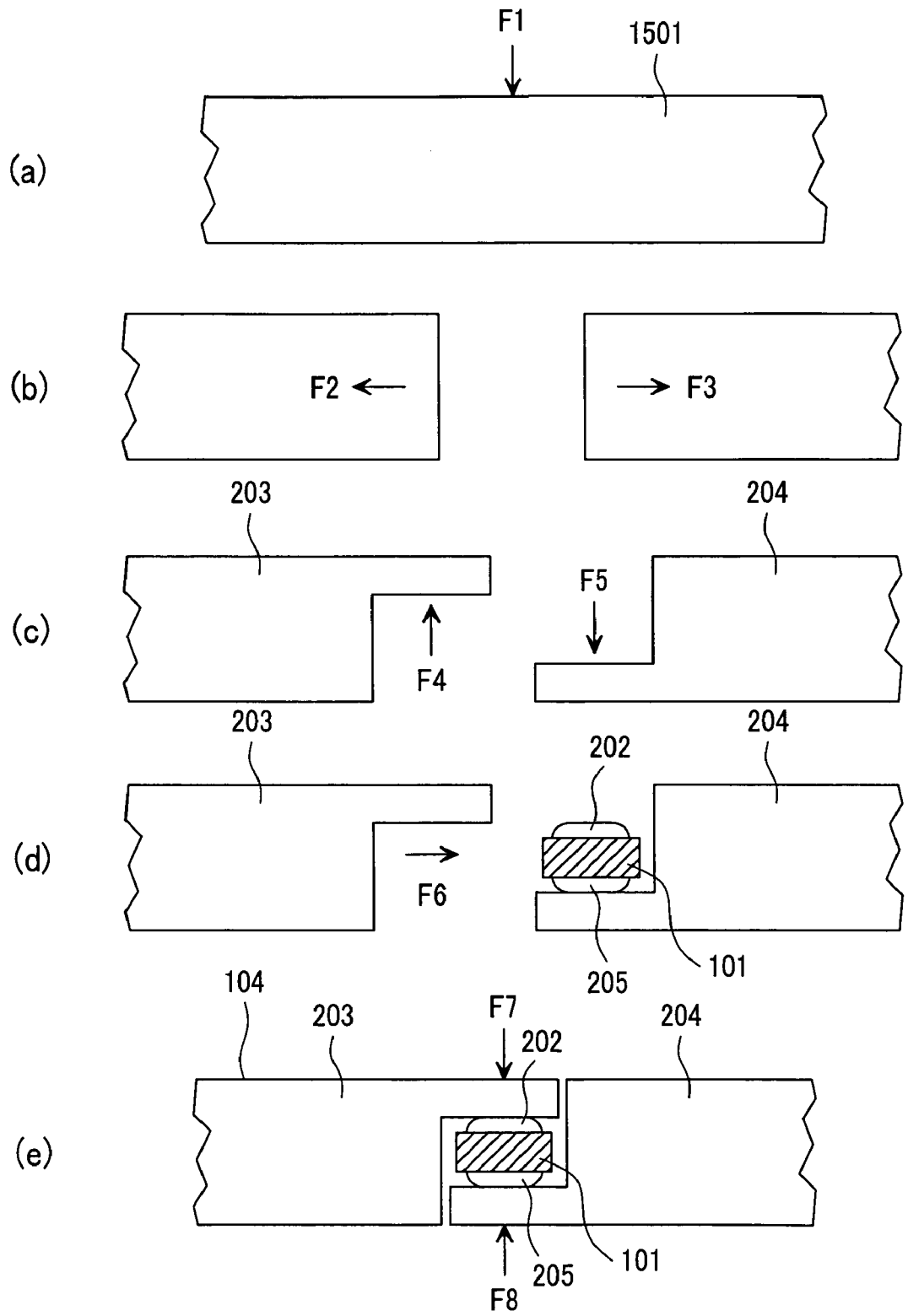
FIG. 17 is a drawing showing the sectional view of a wireless IC tag structure according to another embodiment of the present invention.

FIG. 17 shows manufacturing processes for efficiently forming an antenna with a narrow width resistant to congestion control shown in the first to third embodiments. Also in this embodiment, like the first embodiment, the wireless IC tag 104 comprises the IC tag chip 101 and a pair of antenna conductors 203 and 204 with a circular section, connected to its electrodes. The pair of antenna conductors extends in an axial direction with the IC tag chip 101 sandwiched, and constitutes a dipole antenna with a narrow width.

(a) of FIG. 17 shows a sectional shape of a first thin antenna material 1501. A material such as aluminum wire and gold wire industrially manufactured in volume is used. (b) of FIG. 17 is a sectional view of the wire of (a) of FIG. 17 showing a state immediately after the wire of (a) of FIG. 17 is cut by force F1 and laterally separated by forces F2 and F3.

(c) of FIG. 17 is a sectional view showing the antenna 203 sectionally deformed by force F4 and the antennal 204 sectionally plastically deformed by force F5. (d) of FIG. 17 shows a sectional view when an IC tag chip having electrodes on its both sides is mounted in the antenna 204 and the antenna 203 is to be moved by force F6.

(e) of FIG. 17 shows a sectional view of a process by which the bumps 202 and 205 on the upper and lower sides of the IC tag chip 101 are connected to the antennas 203 and 204 respectively by forces F7 and F8.

Sixth Embodiment

Figure 18A:
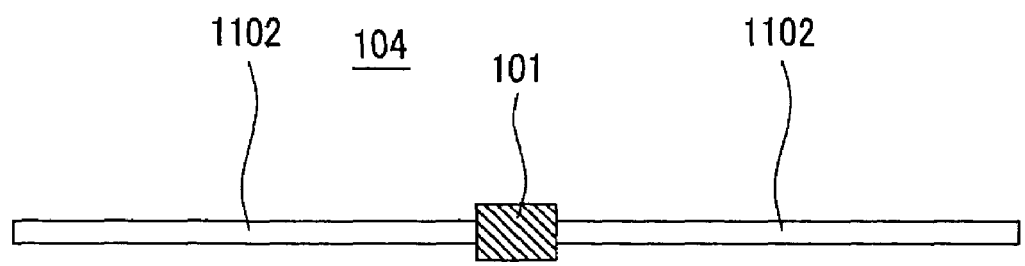
FIG. 18A is a top view of a wireless IC tag according to another embodiment of the present invention.
Figure 18B:
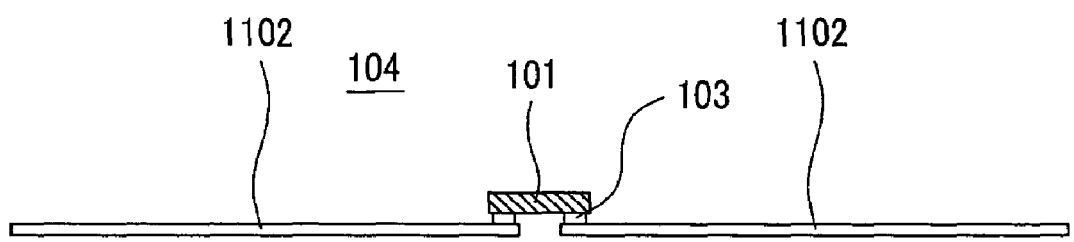
FIG. 18B shows a sectional view of the wireless IC tag of FIG. 18A.

FIG. 18 shows a wireless IC tag according to the embodiment of the present invention. FIG. 18A shows a top view of the embodiment of the present invention. FIG. 18B shows a sectional view of the wireless IC tag 104.

Also in this embodiment, the wireless IC tag 104 comprises the IC tag chip 101 and a pair of antenna conductors 203 and 204 with a circular section, connected to its electrodes. The pair of antenna conductors extends in an axial direction with the IC tag chip 101 sandwiched, and constitutes a dipole antenna with a narrow width. The antennas have rectangular cross sections.

A bump 1103 adheres to the IC tag chip 101 and connects with an antenna 1102. The bump is often made of gold plating but may be made of copper, aluminum, tungsten, and the like. Although the antenna is made of aluminum, copper, silver paste, or the like, it is not limited to these materials. The outside dimension of the IC tag chip is often 1.0 mm square or less. Since the length of the antenna depends on application fields of a desired wireless IC tag, no special limitation needs to be placed on the length of the antenna. Generally, about the half of the wavelength of a frequency band used is often used. For example, although ½-wavelength is 61.2 mm in a frequency band of 2.45 GHz, the antenna is somewhat shorter than that because of the influence of the dielectric constant of an insulating material used as a base material. By manufacturing the wireless IC tag as part of IC chip manufacturing processes, it can be mounted in an IC chip.

Seventh Embodiment

Figure 19A:
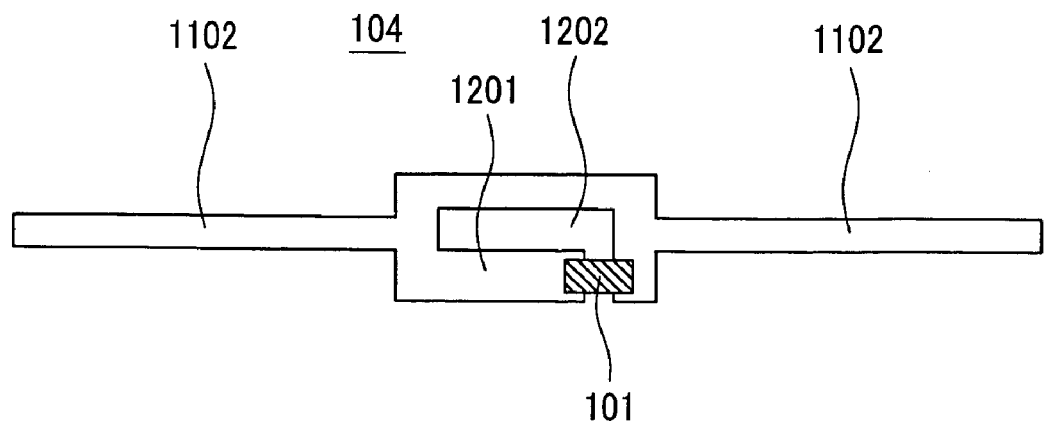
FIG. 19A shows a top view of a wireless IC tag according to another embodiment of the present invention.

FIG. 19 shows a wireless IC tag according to another embodiment of the present invention. FIG. 19A shows a top view of the embodiment of the present invention. The IC tag chip 101 is connected to an impedance matching part 1201 to form the wireless IC tag 104. A slit 1202 exists in the impedance matching part 1201.

Figure 19B:
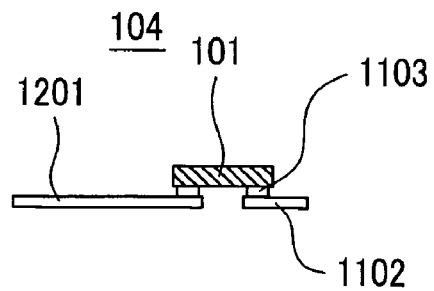
FIG. 19B shows a sectional view of the wireless IC tag of FIG. 19A.

FIG. 19B shows a sectional view. A bump 1103 adheres to the IC tag chip 101 and connects with the impedance matching part 1201. The outside dimension of the IC tag chip 101 is often 1.0 mm square or less. The impedance matching part is necessary to the IC tag chip to efficiently inject electromagnetic waves as energy from the reader into the IC tag chip. The antenna produces resonance with electromagnetic waves. Since resonant voltages and currents rapidly shuttle across the antenna, terminals of the IC tag chip appear to have electrical properties having a concentrated constant to the antenna, and reflection is prone to occur in this portion. This reflection disappears when the characteristic impedance of the antenna and the impedance of input of the IC tag chip match, practical energy is inputted to the IC tag chip, currents efficiently flow into the IC tag chip, electric charges are stored in capacitance within the IC tag chip, and conversion into DC voltages is made. Therefore, the slit 1202 is provided to match the impedance of the antenna with the input impedance of the IC tag chip. The width and length of the slit are important to realize impedance, and it is necessary to set a specific slit width and length according to the characteristics of the IC tag chip.

Although the inventors have found out that it is effective to reduce an antenna size in the IC tag chip 101 having congestion control, even in antennas having the impedance matching part 1202, the antenna 1102 responsible for resonance is required. Like the case of FIG. 1, by reducing the size of the antenna, it is possible to reduce the interference of plural wireless IC tags among antennas, when rotational use of the wireless IC tags is taken into account, to meet an object of the present invention, an upper limit of a projected antenna width should be 1.0 mm or less, and its lower limit should be one micron.

Eighth Embodiment

Figure 20:
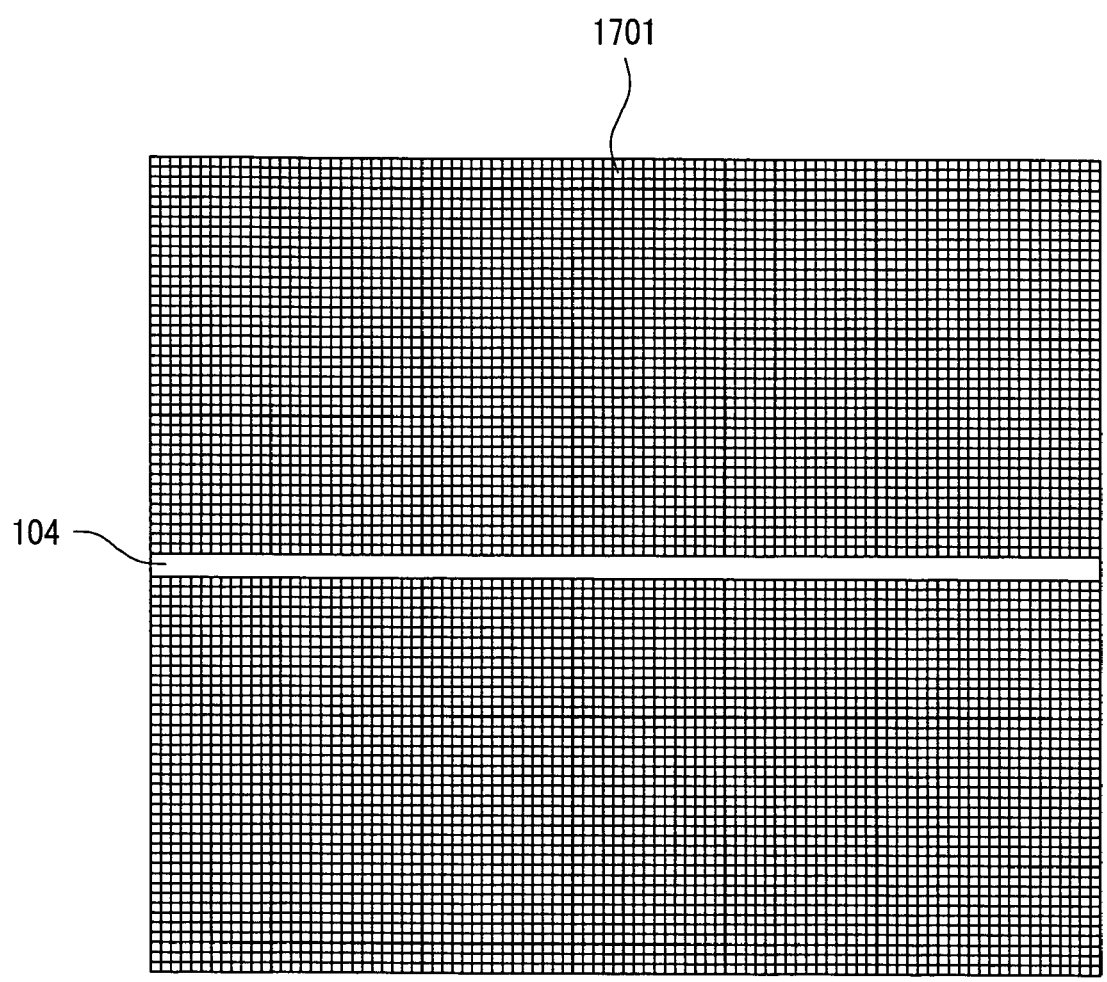
FIG. 20 is a drawing showing an application example of a wireless IC tag of the present invention.

FIG. 20 shows another embodiment of the present invention. In this embodiment, the wireless IC tag 104 is adhered to a cloth 1701 of clothing. There are a large number of linen materials in the cleaning field, and their shapes are very similar. Therefore, there is a strong demand to identify the linen materials by wireless IC tags. This field requires that wireless IC tags are adhered to fabrics without a sense of incongruity, and identification numbers are read by congestion control. When linen materials and clothes are rotated at high speed by hangers and the like, to read their identification numbers from a reader, reading time must be secured, inevitably spreading an area of electromagnetic waves. Therefore, in a state in which plural wireless IC tags exist, before-and-after positional relation must also be shown at the same time as identification, and wireless IC tags with less radio wave interference are required.

Although, in the present invention, the effectiveness of antennas with a narrow width is found out, and the limitation of the width and a method of manufacturing the antennas are proposed, the wireless IC tags having the antennas with a narrow width will exhibit their effect more effectively in combination of being adhered to cloths. Since the wireless IC tags with a narrow width are highly flexible, they are suitable for clothes and tolerant of pressure and bending. The reason that they are tolerant of pressure is that the IC tag chips are surrounded by strong metals as in the embodiment of FIG. 1, and the reason that the wireless IC tags are tolerant of bending is that the IC tag chips can be 0.5 mm square or less and can be placed on a neutral face as shown in FIG. 4A. The form shown in FIG. 20 allows the cloth 1701 itself to be adhered to other clothes, increasing simplicity of adhering the chips to clothes.

The invention claimed is:

1. A wireless IC tag comprising:
an IC tag chip having a memory storing specific identification information; and an antenna, wherein the IC tag chip has at least a congestion control part, and has a function to deliver the identification information via the antenna in response to an inquiry from a reader existing within a communication area, wherein the antenna is a dipole antenna that is connected to the IC tag chip and includes a pair of antenna conductors extending in an axial direction at both sides of the IC tag chip, wherein a width of the antenna conductors is 1.0 mm or less, and wherein plane parts for connection are provided along an axial direction of the antenna in ends of the antenna conductors, and the IC tag chip is sandwiched between the plane parts for connection.

2. A wireless IC tag comprising:

an IC tag chip having a memory storing specific identification information; and an antenna, wherein the IC tag chip has at least a congestion control part, and has a function to deliver the identification information via the antenna in response to an inquiry from a reader existing within a communication area, wherein the antenna is a dipole antenna that is connected to the IC tag chip and includes a pair of antenna conductors extending in an axial direction at both sides of the IC tag chip, wherein a width of the antenna conductors is 1.0 mm or less, wherein a sectional shape of the antenna conductors is circular, and wherein the IC tag chip is disposed inside the ends of the antenna conductors.

3. A wireless IC tag comprising:

an IC tag chip having a memory storing specific identification information; and an antenna, wherein the IC tag chip has at least a congestion control part, and has a function to deliver the identification information via the antenna in response to an inquiry from a reader existing within a communication area, wherein the antenna is a dipole antenna that is connected to the IC tag chip and includes a pair of antenna conductors extending in an axial direction at both sides of the IC tag chip, wherein a width of the antenna conductors is 1.0 mm or less, wherein the IC tag chip has a rectangular plane, and is a double-sided electrode IC tag chip provided with electrodes on a surface and a back surface of the plane, and wherein the electrodes of the IC tag chip are respectively connected with the plane parts for connection provided in ends of the antenna conductors.

4. A wireless IC tag comprising:

an IC tag chip having a memory storing specific identification information; and an antenna, wherein the IC tag chip has at least a congestion control part, and has a function to deliver the identification information via the antenna in response to an inquiry from a reader existing within a communication area, wherein the antenna is a dipole antenna that is connected to the IC tag chip and includes a pair of antenna conductors extending in an axial direction at both sides of the IC tag chip, wherein a width of the antenna conductors is 1.0 mm or less, wherein the antenna conductors have a circular sectional shape, wherein the IC tag chip has a rectangular plane, and is a double-sided electrode IC tag chip provided with electrodes on a surface and a back surface of the plane, and wherein the electrodes of the IC tag chip are respectively connected with the plane parts for connection provided along an axial direction in ends of the antenna conductors.

* * * * *